United States Patent
DiJaili et al.

(10) Patent No.: US 6,950,233 B1
(45) Date of Patent: Sep. 27, 2005

(54) SYSTEM AND METHOD FOR WAVELENGTH CONVERSION USING A VLSOA

(75) Inventors: Sol P. DiJaili, Moraga, CA (US); John M. Wachsman, Dublin, CA (US)

(73) Assignee: Finisar Corporation, Sunnyvale, CA (US)

( * ) Notice: Subject to any disclaimer, the term of this patent is extended or adjusted under 35 U.S.C. 154(b) by 229 days.

(21) Appl. No.: 10/017,200

(22) Filed: Dec. 14, 2001

Related U.S. Application Data

(60) Provisional application No. 60/274,548, filed on Mar. 9, 2001.

(51) Int. Cl.[7] ............................. H01S 3/00; G02F 2/02
(52) U.S. Cl. ....................................... 359/344; 359/326
(58) Field of Search ................................. 359/336, 337, 359/344; 372/50.43; 398/202, 214

(56) References Cited

U.S. PATENT DOCUMENTS

| | | | |
|---|---|---|---|
| 6,195,188 B1 * | 2/2001 | Sekiguchi | 398/152 |
| 6,211,983 B1 * | 4/2001 | Shiragaki | 398/180 |
| 6,249,373 B1 * | 6/2001 | Woodward | 359/344 |
| 6,317,252 B1 * | 11/2001 | Vahala et al. | 359/326 |
| 6,331,991 B1 * | 12/2001 | Mahgerefteh | 372/33 |
| 6,349,106 B1 * | 2/2002 | Coldren | 372/50 |
| 6,456,417 B1 * | 9/2002 | Maywar et al. | 359/245 |
| 6,580,739 B1 * | 6/2003 | Coldren | 372/50 |
| 6,608,854 B1 * | 8/2003 | Watanabe | 372/96 |
| 6,614,583 B1 * | 9/2003 | Wachsman | 359/326 |
| 6,624,000 B1 * | 9/2003 | Coldren | 438/29 |
| 6,658,035 B1 * | 12/2003 | Mason et al. | 372/50 |

FOREIGN PATENT DOCUMENTS

JP        121893    *   4/2003

* cited by examiner

*Primary Examiner*—Mark Hellner
(74) *Attorney, Agent, or Firm*—Workman Nydegger

(57) ABSTRACT

A VLSOA is used as a wavelength converter. The signal is input to the VLSOA, and the laser output carries the signal on a second wavelength.

46 Claims, 16 Drawing Sheets

SYSTEM AND METHOD FOR WAVELENGTH CONVERSION USING A VLSOA

RELATED APPLICATION

This application claims priority under 35 U.S.C. §119(e) from U.S. Patent Application Ser. No. 60/274,548, entitled, "System and Method for Wavelength Conversion Using a VLSOA," by Sol DiJaili, filed Mar. 9, 2001, which is incorporated by reference in its entirety.

BACKGROUND

1. Field of the Invention

This invention relates to optical communications systems, in particular, to wavelength conversion. Still more particularly, the present invention relates to wavelength conversion using vertical lasing semiconductor optical amplifiers (VLSOA) and other lasing semiconductor optical amplifiers.

2. Background of the Invention

As the result of continuous advances in technology, particularly in the area of networking such as the Internet, there is an increasing demand for communications bandwidth. For example, the transmission of data over a telephone company's trunk lines, the transmission of images or video over the Internet, the transfer of large amounts of data as might be required in transaction processing, or videoconferencing implemented over a public telephone network typically require the high speed transmission of large amounts of data. As applications such as these become more prevalent, the demand for communications bandwidth capacity will only increase.

Optical fiber is a transmission medium that is well suited to meet this increasing demand. Optical fiber has an inherent bandwidth that is much greater than metal-based conductors, such as twisted pair or coaxial cable; and protocols such as the SONET optical carrier (OC) protocols have been developed for the transmission of data over optical fibers. Typical communications system based on optical fibers include a transmitter, an optical fiber, and a receiver. The transmitter converts the data to be communicated into an optical form and then transmits the resulting optical signal via the optical fiber to the receiver. The receiver recovers the original data from the received optical signal.

To maximize the amount of data transmitted on a single fiber, many different wavelengths of light are carried over the same optical fiber. Each wavelength acts as a different channel, carrying its own signal. This allows the data capacity of a single optical fiber to be greatly increased. When data in a network must be switched, often the signals from two separate fiber inputs must be output in a single fiber. If the signals are carried by the fiber inputs on the same wavelength, a problem known as signal blocking results. In such a case, if both signals remain on the same wavelength and are output in the single output fiber, interference and loss of data will result.

FIG. 1 is a block diagram of a prior art switch where such a problem may occur. A signal on a first wavelength ("$\lambda_1$") enters the switch 8 on a first fiber 2. A second signal carried on the same first wavelength $\lambda_1$ enters the switch 8 on a second fiber 4. The signals must both be output on a single output fiber 10. In order for the output fiber 10 to carry both signals without blocking, one of the signals on the first wavelength $\lambda_1$ must be converted to a second wavelength ("$\lambda_2$"). Otherwise, interference and loss of data will result.

In the past, wavelength conversion has been accomplished through optical-electrical-optical ("OEO") systems and Mach Zhender systems.

FIG. 2a is a block diagram of a prior art OEO system for wavelength conversion. In an OEO wavelength conversion system, the input is optical, the wavelength conversion happens electrically, and then the signal is output optically. As seen in FIG. 2a, the signal is carried in an input optical fiber 14 on a first wavelength $\lambda_1$. An optical detector 16 detects the signal and outputs the signal in electrical form to an electrical remodulator 18. The electrical remodulator 18 remodulates the signal so that the signal is carried by a new wavelength $\lambda_2$. A source 20 converts the signal from the electrical domain to the optical domain and resends the signal, now on second wavelength $\lambda_2$ on an optical fiber output 22. The signal remains the same in both the input 14 and the output 22, but the wavelength that carries the signal changes. Because the signal must be converted from optical to electrical, then converted back to optical, the system has the drawbacks of being relatively large, complex and expensive, and further suffers losses from the conversion between electrical and optical.

FIG. 2b is a block diagram of a Mach Zhender modulator that converts a signal from one wavelength to another. The signal is carried by a first wavelength $\lambda_1$ on an input optical fiber 24. A second optical fiber input 26 carries a second signal at a second wavelength $\lambda_2$. A splitter 28 or alternatively a directional coupler splits the second signal into two parts. The signal on the first wavelength $\lambda_1$ is combined with one part of the second signal at a combiner 38 and this combination enters an amplifier 30 such as a semiconductor optical amplifier ("SOA"). Within the amplifier 30, crosstalk occurs between the signal on the first wavelength $\lambda_1$ and the second wavelength $\lambda_2$. The other part of the second signal enters a second amplifier 32. The outputs of the first amplifier 30 and second amplifier 32 are combined at a combiner 34 and output on an optical fiber 36. Due to the interference between the first and second wavelengths, the signal is carried by the second wavelength $\lambda_2$ in the resulting combined output. However, because the Mach Zhender uses multiple amplifiers and requires an independent second wavelength input, the system has the drawbacks of being relatively large, complex and expensive. The Mach Zhender is also subject to cross-phase modulation and gain saturation.

Systems such as those described above often require pre-amplifiers to boost the signal input to the wavelength converter to counter signal loss when converted. These pre-amplifiers add more size and expense to the wavelength converter.

Many applications require an array of wavelength converters for many different wavelengths. In such applications, extra wavelength converters must be available to replace those that have failed. Storing a different wavelength converter for each wavelength is expensive.

SUMMARY OF THE INVENTION

The present invention converts the wavelength of an optical signal. The optical signal on a first wavelength is the input, and a corresponding signal on a second wavelength is the wavelength converted output.

One embodiment is a method for converting the optical signal from one wavelength to a second wavelength. A VLSOA is used to convert the wavelength of the signal. The VLSOA comprises an input, a laser cavity with an optical path, an amplifying path through the laser cavity, and a laser output. The optical signal is input to the input of the VLSOA. The laser cavity is pumped to exceed the lasing threshold of the laser cavity. As the input optical signal propagates along the amplifying path of the VLSOA, an output optical signal is output from the laser output of the VLSOA. The output optical signal is based on the input signal and is on the second wavelength.

Another embodiment is an apparatus for converting an input optical signal from a first wavelength to a second wavelength. The apparatus comprises a first VLSOA. The first VLSOA comprises an input, a laser cavity with an optical path, an amplifying path through the laser cavity, a pump input, and a laser output. The input optical signal is input to the input of the first VLSOA. A pump that exceeds the lasing threshold of the laser cavity is input to the pump input. As the input optical signal propagates along the amplifying path of the first VLSOA, an intermediate optical signal is output from the laser output of the first VLSOA. The apparatus further comprises a second VLSOA. The second VLSOA comprises an input, a laser cavity with an optical path having an optical path length, an amplifying path through the laser cavity, a pump input, and a laser output. The intermediate optical signal is input to the input of the second VLSOA. A pump that exceeds the lasing threshold of the laser cavity is input to the pump input. As the intermediate optical signal propagates along the amplifying path of the second VLSOA, an output optical signal is output from the laser output of the second VLSOA. The output optical signal is based on the input optical signal and has the second wavelength.

A third embodiment is another method for converting an input optical signal from a first wavelength to a second wavelength. Two VLSOAs, each comprising an input, a laser cavity with an optical path having an optical path length, an amplifying path connected to the input and passing through the laser cavity, and a laser output, are used to convert the wavelength of the signal. The input optical signal is received at the input of the first VLSOA. The laser cavity of the first VLSOA is pumped to exceed the laser threshold for the laser cavity. As the input optical signal propagates along the amplifying path of the first VLSOA, an intermediate optical signal is output from the laser output of the first VLSOA. The intermediate signal is received at the input of the second VLSOA. The laser cavity of the second VLSOA is pumped to exceed the laser threshold for the laser cavity. In response to the intermediate optical signal propagating along the amplifying path of the second VLSOA, an output optical signal is output from the laser output of the second VLSOA. The output optical signal is based on the input optical signal and has the second wavelength.

Yet another embodiment is another apparatus for converting an input optical signal from a first wavelength to a selected second wavelength. The apparatus comprises an input, a selector, and a plurality of VLSOAs. The input receives the input optical signal. The selector directs the input optical signal to a selected one of the plurality of VLSOAs. Each of the VLSOAs comprises an input, a laser cavity with an optical path having an optical path length, an amplifying path connected to the input and passing through the laser cavity, a pump input, and a laser output. The input optical signal is received at the input of the selected one of the plurality of VLSOAs. A pump that exceeds laser threshold for the laser cavity is received at the pump input. In response to the input optical signal propagating along the amplifying path of the selected VLSOA, an output optical signal is output from the laser output of the selected VLSOA. The output optical signal is based on the input optical signal and has the second wavelength, the second wavelength being determined by the optical path length of the selected VLSOA.

DETAILED DESCRIPTION OF THE PREFERRED EMBODIMENTS

Figure 1:
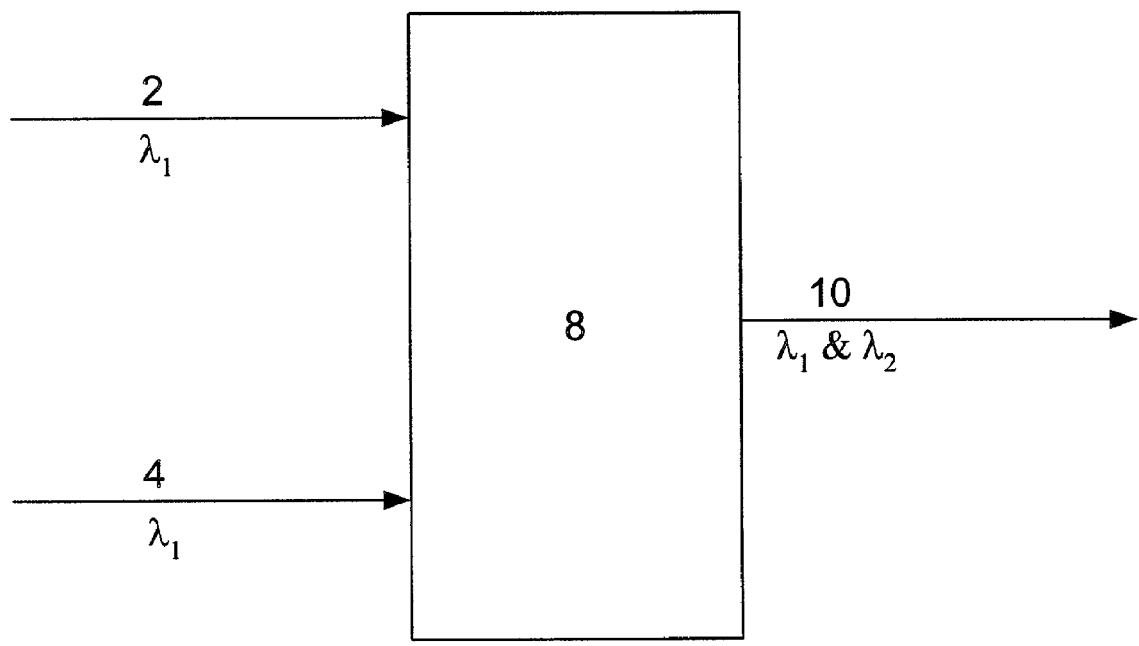
FIG. 1 is a block diagram of a switch wherein switch blocking may occur.
Figure 2A:
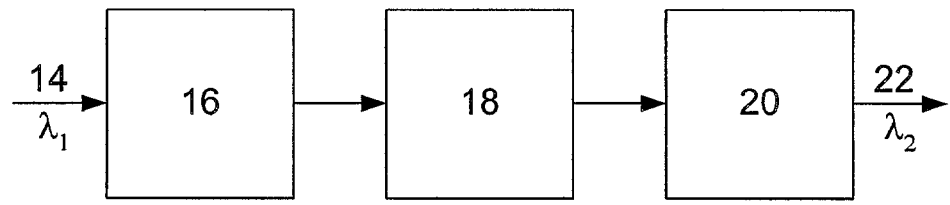
FIG. 2a is a block diagram of an OEO system for wavelength conversion.
Figure 2B:
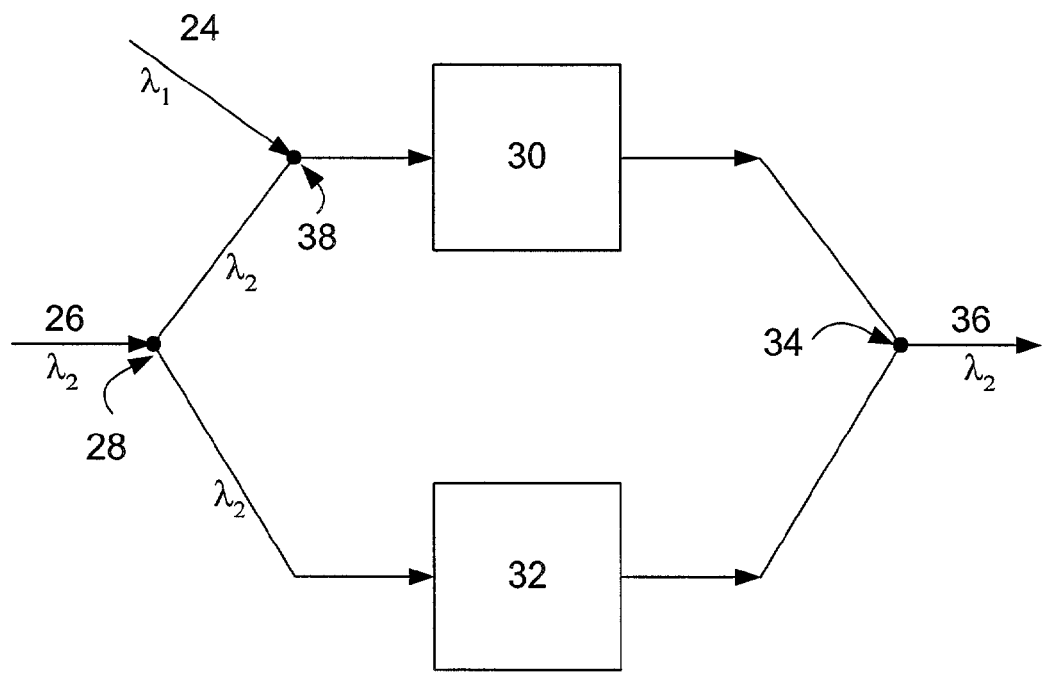
FIG. 2b is a block diagram of a Mach Zhender modulator used for wavelength conversion.

An embodiment of a wavelength converter utilizes a vertical lasing semiconductor optical amplifier (VLSOA). The VLSOA is one type of lasing semiconductor optical amplifier (LSOA). Other embodiments utilize other types of LSOAs, such as transverse lasing semiconductor optical amplifiers (TLSOA) or longitudinal lasing semiconductor optical amplifiers (LLSOA). FIGS. 1, 2a, and 2b were discussed previously.

Figure 3:
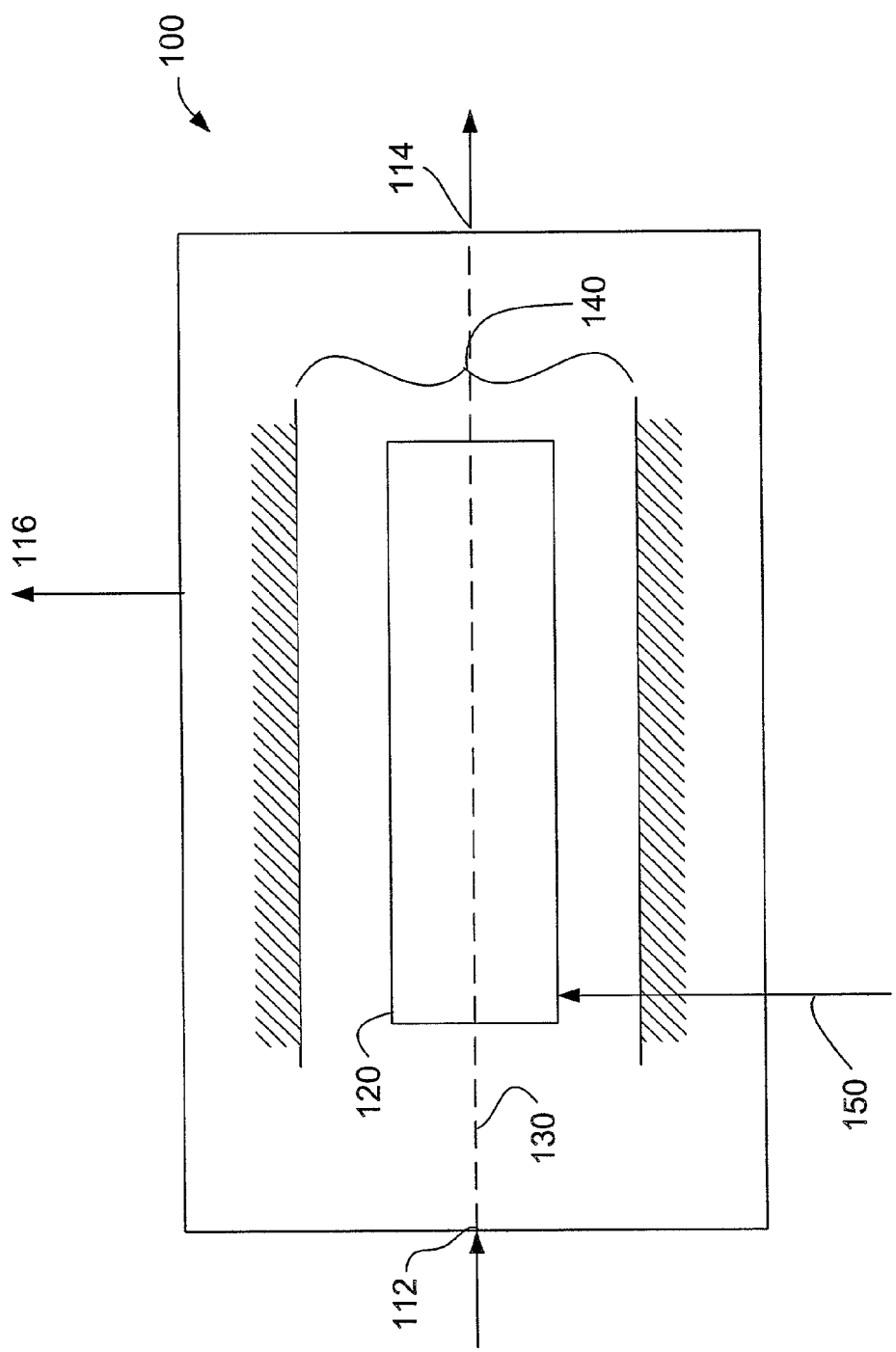
FIG. 3 is a diagram of a vertical lasing semiconductor optical amplifier (VLSOA) in accordance with the present invention.

FIG. 3 is a diagram of a VLSOA 100 in accordance with the present invention. The VLSOA 100 has an input 112 and an output 114. The VLSOA 100 further includes a semiconductor gain medium 120, with an amplifying path 130 coupled between the input 112 and the output 114 of the VLSOA 100 and traveling through the semiconductor gain medium 120. The VLSOA 100 further includes a laser cavity 140 including the semiconductor gain medium 120, and a pump input 150 coupled to the semiconductor gain medium 120. The laser cavity 140 is oriented vertically with respect to the amplifying path 130. The pump input 150 is for receiving a pump to pump the semiconductor gain medium 120 above a lasing threshold for the laser cavity 140. When pumped above threshold, the laser cavity 140 generates a laser signal, which will be referenced to as a ballast laser signal. The ballast laser signal exits the VLSOA 100 via ballast laser output 116.

Figure 4:
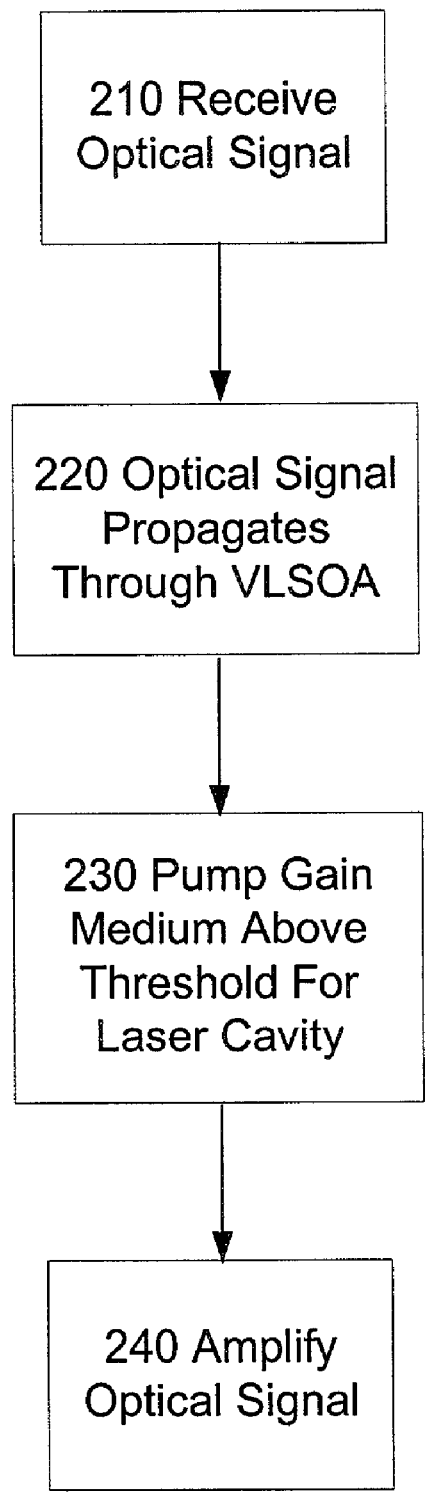
FIG. 4 is a flow diagram illustrating operation of VLSOA when it is used as an amplifier.

FIG. 4 is a flow diagram illustrating operation of VLSOA 100 when it is used as an amplifier. The VLSOA 100 receives 210 an optical signal at its input 112. The optical signal propagates 220 along the amplifying path 130. The pump signal received at pump input 150 pumps 230 the semiconductor gain medium above a lasing threshold for the laser cavity 140. When lasing occurs, the round-trip gain offsets the round-trip losses for the laser cavity 140. In other words, the gain of the semiconductor gain medium 120 is clamped to the gain value necessary to offset the round-trip losses. The optical signal is amplified 240 according to this gain value as it propagates along the amplifying path 130 (i.e., through the semiconductor gain medium 120). The amplified signal exits the VLSOA 100 via the output 114.

Note that the gain experienced by the optical signal as it propagates through the VLSOA 100 is determined in part by the gain value of the semiconductor gain medium 120 (it is also determined, for example, by the length of the amplifying path 130) and this gain value, in turn, is determined primarily by the lasing threshold for the laser cavity 140. In particular, the gain experienced by the optical signal as it propagates through each VLSOA 100 is substantially independent of the amplitude of the optical signal. This is in direct contrast to the situation with non-lasing SOAs and overcomes the distortion and crosstalk disadvantages typical of non-lasing SOAs.

Figure 5A:
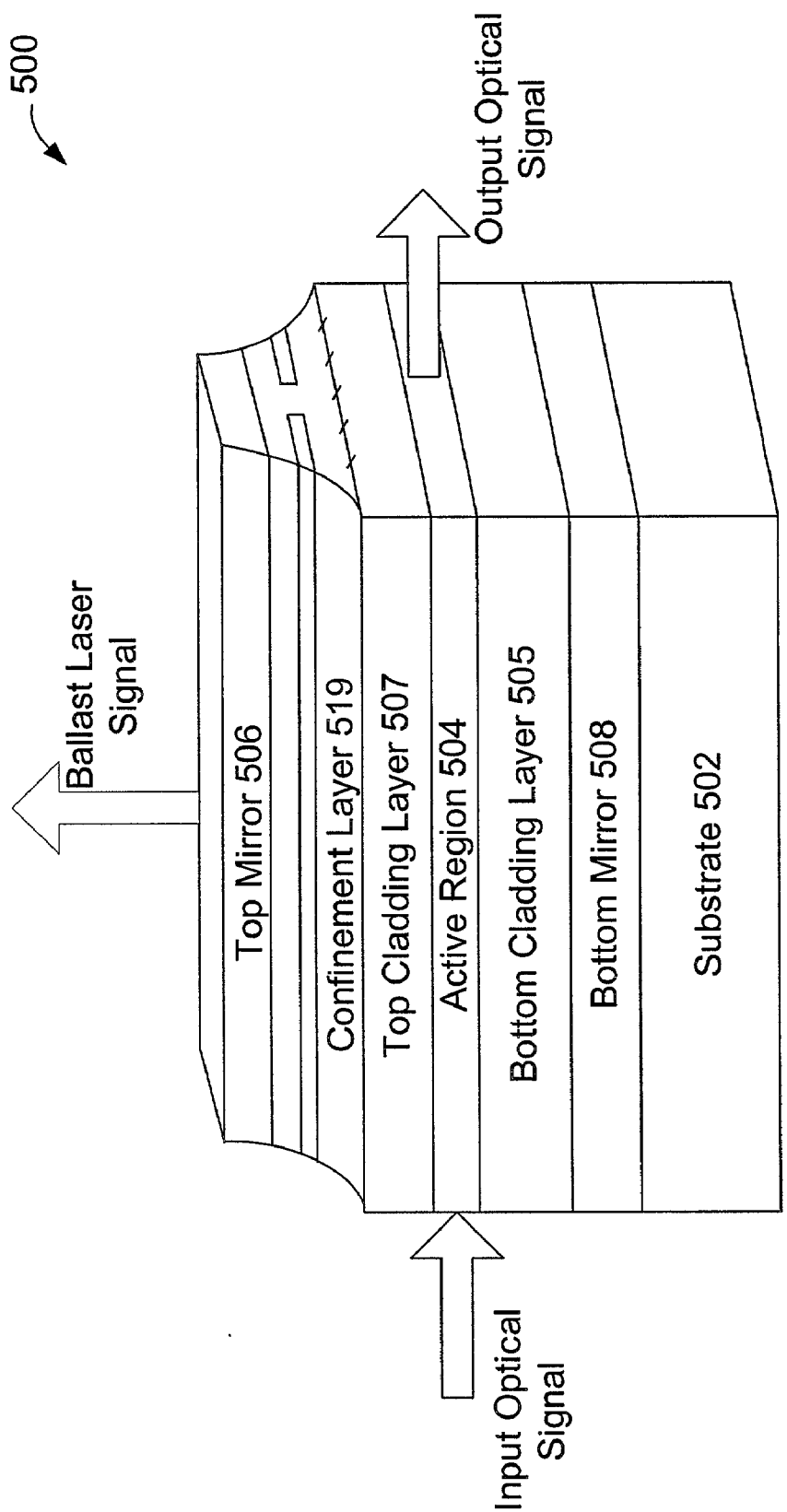
FIG. 5a is a perspective view of a preferred embodiment of a VLSOA according to the present invention.
Figure 5B:
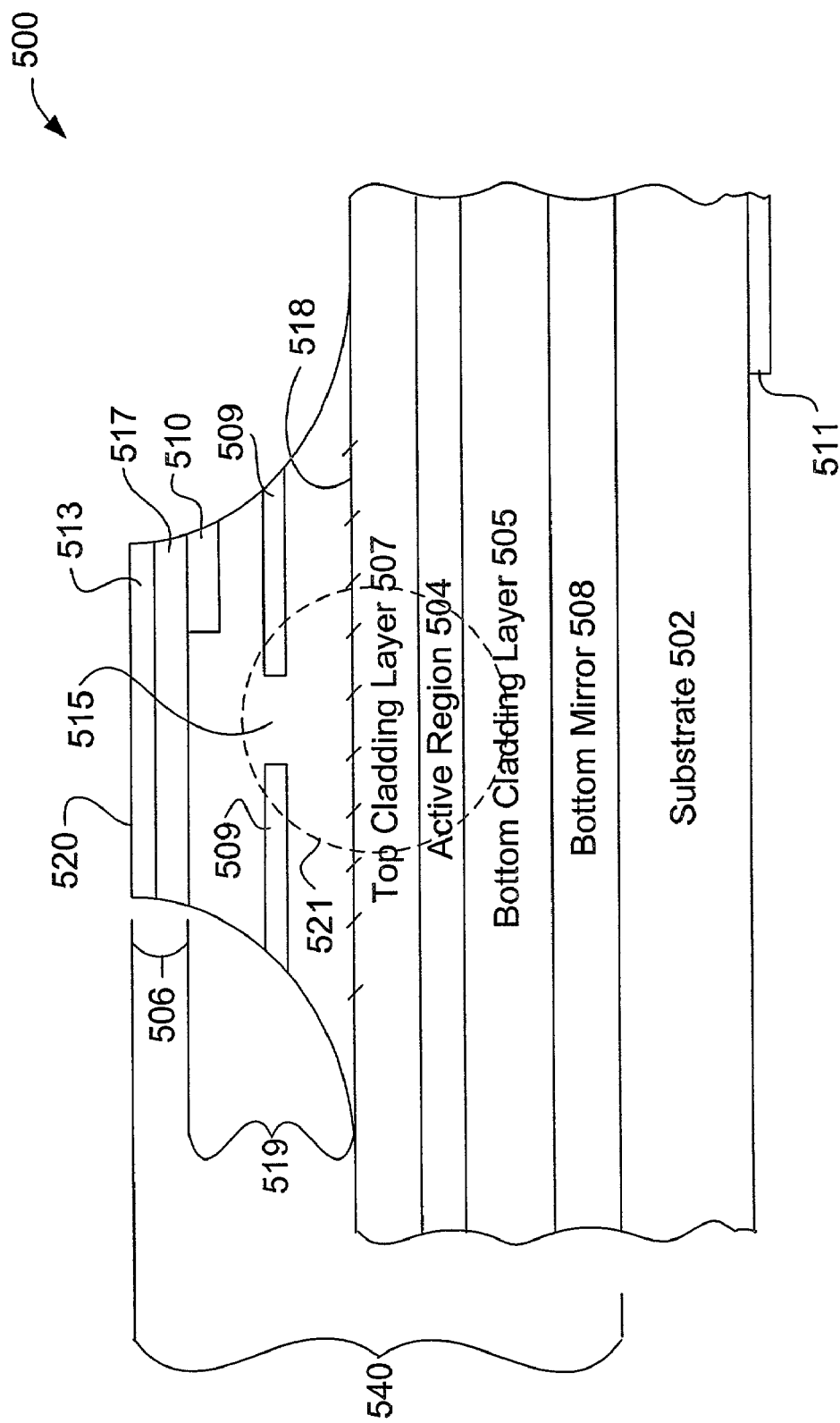
FIG. 5b is a transverse cross-section of a preferred embodiment of a VLSOA according to the present invention.
Figure 5C:
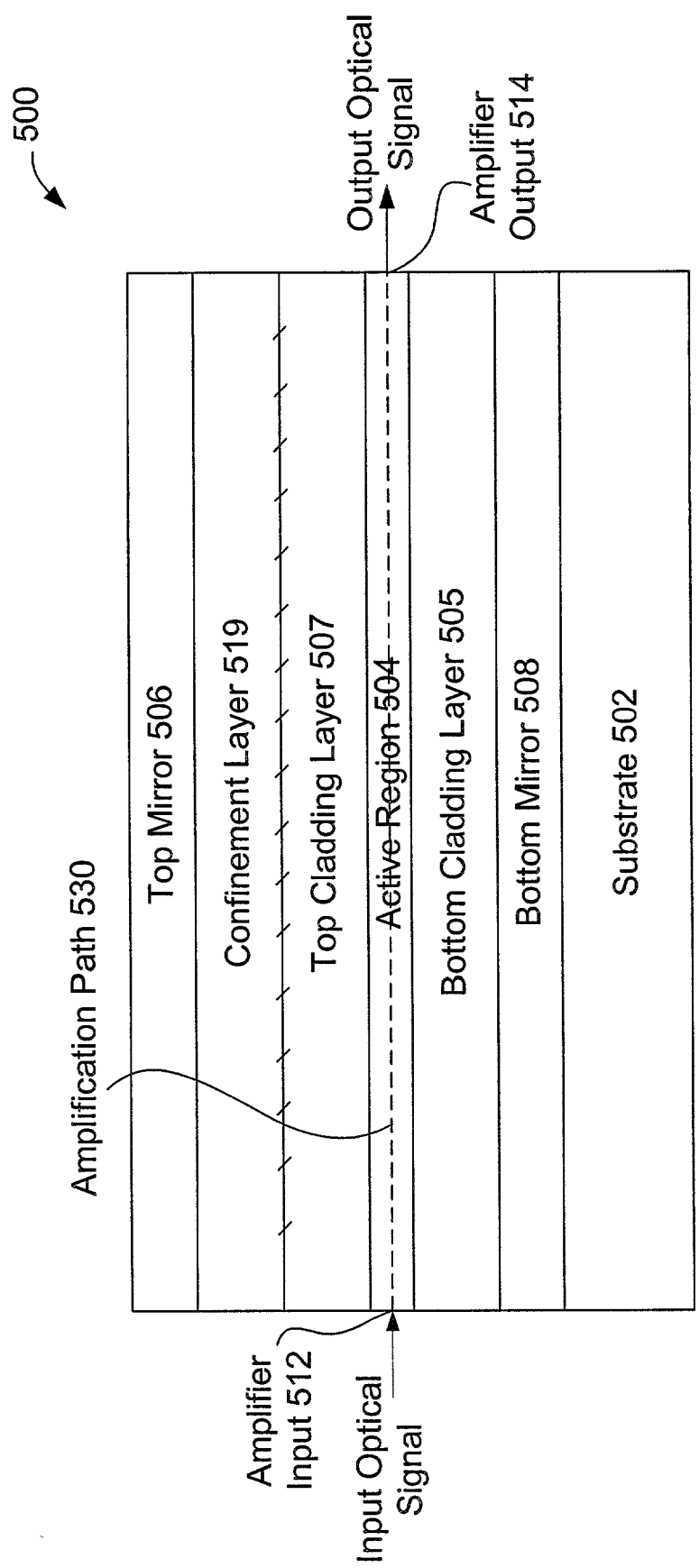
FIG. 5c is a longitudinal cross-section of a preferred embodiment of a VLSOA according to the present invention.

FIGS. 5a–5c are a perspective view, transverse cross-section, and longitudinal cross-section, respectively, of a preferred embodiment of a VLSOA 500 according to the present invention, with FIG. 5b showing the most detail.

Referring to FIG. 5b and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

Comparing to FIG. 3, the semiconductor gain medium 120 includes the active region 504 and the laser cavity 140 is formed primarily by the two mirrors 506 and 508 and the active region 504. This embodiment is electrically pumped so the pump input 150 includes the electrical contacts 510, 511.

VLSOA 500 is a vertical lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements. In most cases, optical elements which are coupled directly to VLSOA 500 will be coupled to the amplifying path 530 within the VLSOA. Depending on the manner of integration, the optical input 512 and output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 is a layered structure, allowing the VLSOA 500 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505, 507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 5.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 5 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510, 511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510, 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 5, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

When used as an amplifier, VLSOA 500 operates as follows. Pump current is injected through contacts 510, 511, or, more precisely, holes are injected through contact 510 and electrons through contact 511. These holes and electrons flow to the active region 504, where they increase the carrier density in the active region 504. That is, the pump current is used to pump the active region 504. The pump current is laterally confined by aperture 515 and confinement structure 509. The pump current is sufficiently high to exceed a lasing threshold for vertical cavity 540. As a result, laser radiation is generated by the vertical cavity 540. This laser radiation may be emitted from the vertical cavity, for example, through the top surface 520 or into the substrate 502 or it may be generated but not actually emitted from the VLSOA 500. The laser radiation may lie in the visible, infrared, ultraviolet or other frequency range.

While the laser cavity 540 is operating above the lasing threshold, an optical signal is received at input 512 and propagates through the VLSOA 500 along amplifying path 530. As the optical signal propagates through the active region 504, the optical signal is amplified by a gain multiplier due to stimulated emission of additional photons. The gain multiplier is substantially constant (i.e., independent of the amplitude of the optical signal) because the laser radiation produced by laser cavity 540 acts as a ballast to prevent gain saturation. That is, when the optical signal is weaker, fewer additional photons are stimulated by the optical signal, but more laser radiation is generated. But when the optical signal is stronger, more additional photons are stimulated by the optical signal, but less radiation is generated. Typically, the value of the constant gain multiplier is inversely proportional to the loss of the cavity mirrors 506 and 508. For example, ignoring internal loss, if a 0.2% mirror loss (99.8% reflectivity) results in a gain of 10 dB (10 times), then a three times larger 0.6% loss (99.4% reflectivity) would result in a roughly three times larger logarithmic gain of 30 dB (1000 times) for otherwise identical VLSOAs 500. The amplified signal exits the VLSOA 500 at output 514.

Often, it is useful to combine a VLSOA with some other optical element. These combinations may be implemented as combinations of discrete devices, which are coupled together by optical fibers. Alternatively, the combinations may be implemented as integrated optics, in which many optical elements are integrated onto a common substrate.

The integration of VLSOAs with other optical elements may be implemented using any number of techniques. In one approach, both the VLSOA and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface, This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

Figure 6:
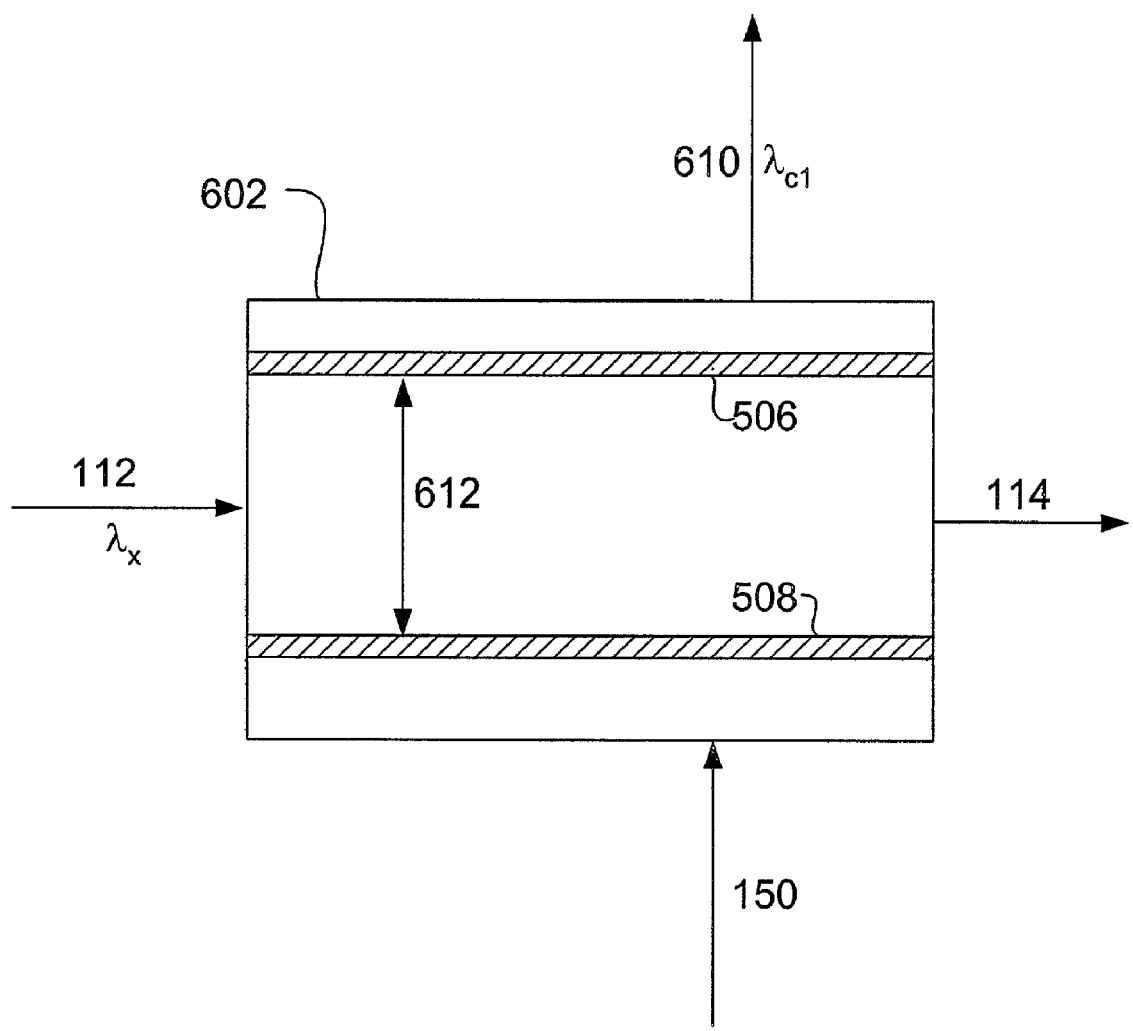
FIG. 6 is a diagram of a VLSOA used as a fixed wavelength converter.

FIG. 6 is a diagram of a VLSOA 602 used as a fixed wavelength converter. The VLSOA 602 has an input 112 to the amplifying path, an output 114 of the amplifying path, a pump input 150 for pumping the active region, and a laser output 610 for the laser mode of the laser cavity. The laser output 610 of the VLSOA 602 has a constant wavelength $\lambda_{c1}$. The wavelength $\lambda_{c1}$, of the laser output 610 is determined by the optical path length of the laser cavity. This optical path length is fixed in the VLSOA 602. Thus, the VLSOA 602 acts as a fixed wavelength converter.

The optical path length of the laser cavity, and the wavelength $\lambda_{c1}$, of the laser output 610 are primarily determined by the distance 612 between the mirrors 506 and 508 and the refractive index of the materials between the mirrors 506 and 508. The optical path length can be changed physically, electro-optically, photo-optically, thermo-optically, through carrier injection, and by other methods. In the VLSOA 602, both the distance 612 between the mirrors 506 and 508 and the refractive index are fixed. Therefore, the wavelength $\lambda_{c1}$ of the laser output 610 is also fixed. Since the distance 612 between the mirrors 506 and 508 and the index of refraction are both independent of the wavelength $\lambda_x$ of the input 112, the wavelength $\lambda_{c1}$ of the laser output 610 is fixed, independent of the wavelength $\lambda_x$ of the input 112.

The VLSOA 602 acts as a wavelength converter because the wavelength $\lambda_{c1}$ of the laser output 610 is independent of the wavelength $\lambda_x$ of the signal being amplified and, in fact, can be either shorter or longer than the wavelength of the signal being amplified. Hence, this type of wavelength converter has an advantage over conventional SOA-based wavelength converters in that it can convert to either a shorter or a longer wavelength. Other advantages include integration of the output laser and amplifier into a single device, with high speed and a large dynamic range.

When functioning as a wavelength converter, as in FIG. 6, the VLSOA 602 is configured to function as an inverter. In this application, the amplifier input 112 serves as the input to the inverter and the laser output 610 serves as the output. The pump 150 acts as a power source and the amplifier output 114 is discarded for wavelength conversion purposes. This configuration takes advantage of the fact that the laser output 610 acts as a ballast. In other words, if the amplifier output 114 is strong, the laser output 610 will be weak. But if the amplifier output 114 is weak, the laser output 610 will be strong. Hence, if a weak signal (a digital "0") is input to the amplifier input 112, the resulting amplifier output 114 will still be relatively weak and the laser output 610 will be strong (a digital "1"). Conversely, if a strong signal (digital "1") is input to the amplifier input 112, the resulting amplifier output 114 will also be strong and the laser output 610 will be weak (digital "0"). Taken to an extreme, if no signal is input to the VLSOA 602, there will be no amplifier output 114 and the laser output 610 will have its maximum strength. On the other hand, if a very strong signal is input to the VLSOA 602, the gain region will be saturated and lasing will be extinguished, resulting in no laser output 610. Hence the VLSOA 602 operates as an inverter when the laser output 610 is used as the primary output of the device.

By taking the laser output 610 as the output, the VLSOA 602 acts to convert the wavelength of a signal. However, as shown above, the signal output at the laser output 610 is the input 112 signal inverted. Also as shown above, the wavelength $\lambda_{c1}$ of the laser output 610 is fixed, no matter what the wavelength $\lambda_x$ of the input 112 is. Therefore, the signal, carried by an input 112 of any wavelength $\lambda_x$, is inverted and converted to the wavelength $\lambda_{c1}$ of the laser output 610. The VLSOA 602 in inverter configuration functions as a fixed wavelength converter. Consistent with the present invention, VLSOAs with different refractive indices and mirror positions can be manufactured and used to provide fixed wavelength conversion into different wavelengths.

Additionally, the fixed wavelength converter does not require a pre-amplifier. The VLSOA is capable of a generating a high power laser output 610 so that such a pre-amplifier is unnecessary.

Figure 7:
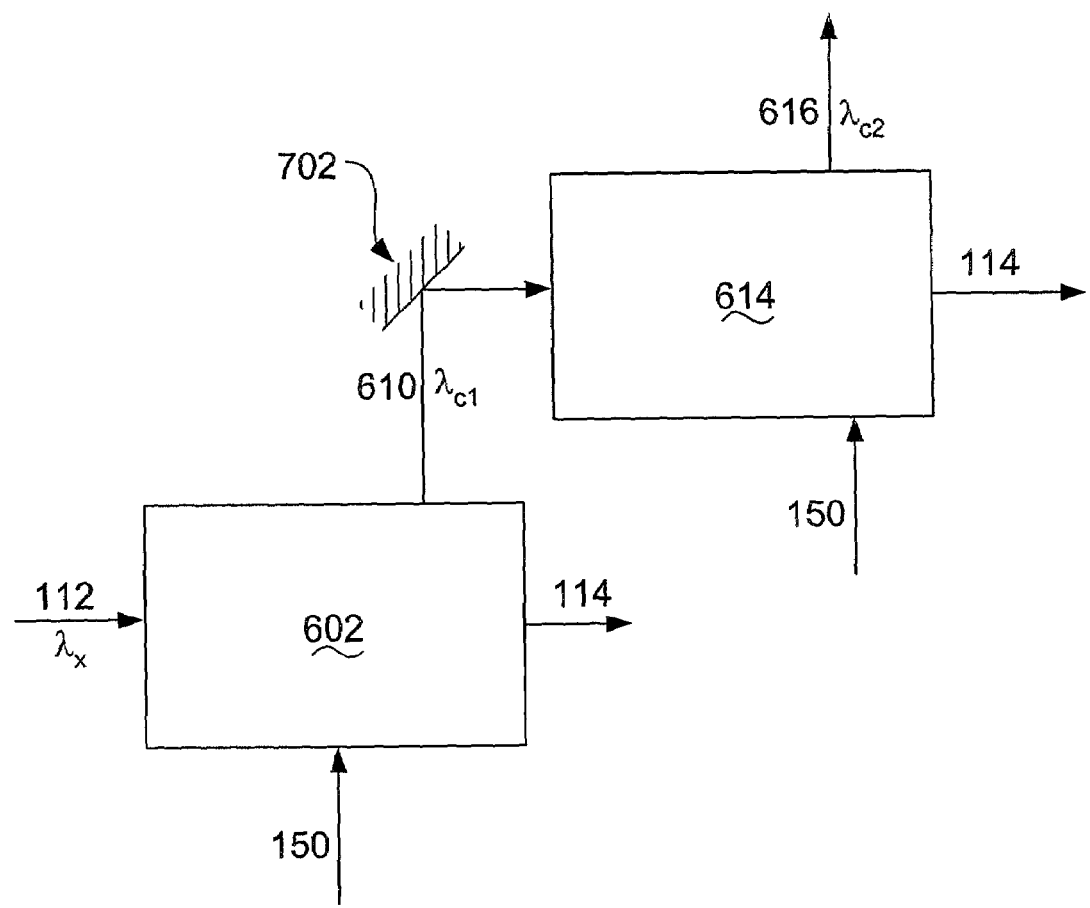
FIG. 7 is a block diagram of another embodiment of a fixed wavelength converter.

FIG. 7 is a block diagram of another embodiment of a fixed wavelength converter. The embodiment of FIG. 7 includes the VLSOA 602 of FIG. 6 as a first VLSOA. The input signal 112 of any wavelength $\lambda_x$ enters the first VLSOA 602. The laser output 610 of the first VLSOA 602 carries the input signal on a fixed wavelength $\lambda_{c1}$. The wavelength $\lambda_{c1}$ is determined by the physical properties of the VLSOA 602, including the index of refraction and the distance between the mirrors 612, as discussed above. Again as discussed above, in the laser output 610 the input signal has been inverted.

This inverted signal 610 is an intermediate signal and is provided as input to a second VLSOA 614. This can be done by using a mirror 702, by positioning the VLSOAs 602, 614 with orthogonal orientations, or using other methods to direct the signal 610 from the first VLSOA 602 into the second VLSOA 614. The laser output 616 of the second VLSOA 614 acts as the final output of the wavelength converter. As with the first VLSOA 602, the amplifier output 114 of the second VLSOA 614 is discarded. Since the second VLSOA 614 also acts as an inverter, the signal is re-inverted so that the signal is returned to its original form but at a wavelength, $\lambda_{c2}$, which may or may not be the same as wavelength $\lambda_{c1}$.

The optical path length of the laser cavity of the second VLSOA 614 determines the wavelength $\lambda_{c2}$ of laser output 616. This optical path length is fixed, and is determined by the distance between the mirrors and the index of refraction of the materials of the second VLSOA 614. The second VLSOA 614 is similar in structure to the first VLSOA 602. As discussed above, an input of any wavelength will result in the same constant wavelength output. Thus, in the embodiment of FIG. 7, the wavelength $\lambda_{c1}$ of the output 610 of the first VLSOA 602 has no bearing on the wavelength $\lambda_{c2}$ that carries the signal. The final, converted, wavelength is determined by the characteristics of the second VLSOA 614. Thus, the embodiment shown in FIG. 7 has an input of a signal on any first wavelength $\lambda_x$ and an output of the same, non-inverted, signal on a second wavelength $\lambda_{c2}$, the second wavelength $\lambda_{c2}$ being fixed by the characteristics of the second VLSOA 614.

Figure 8:
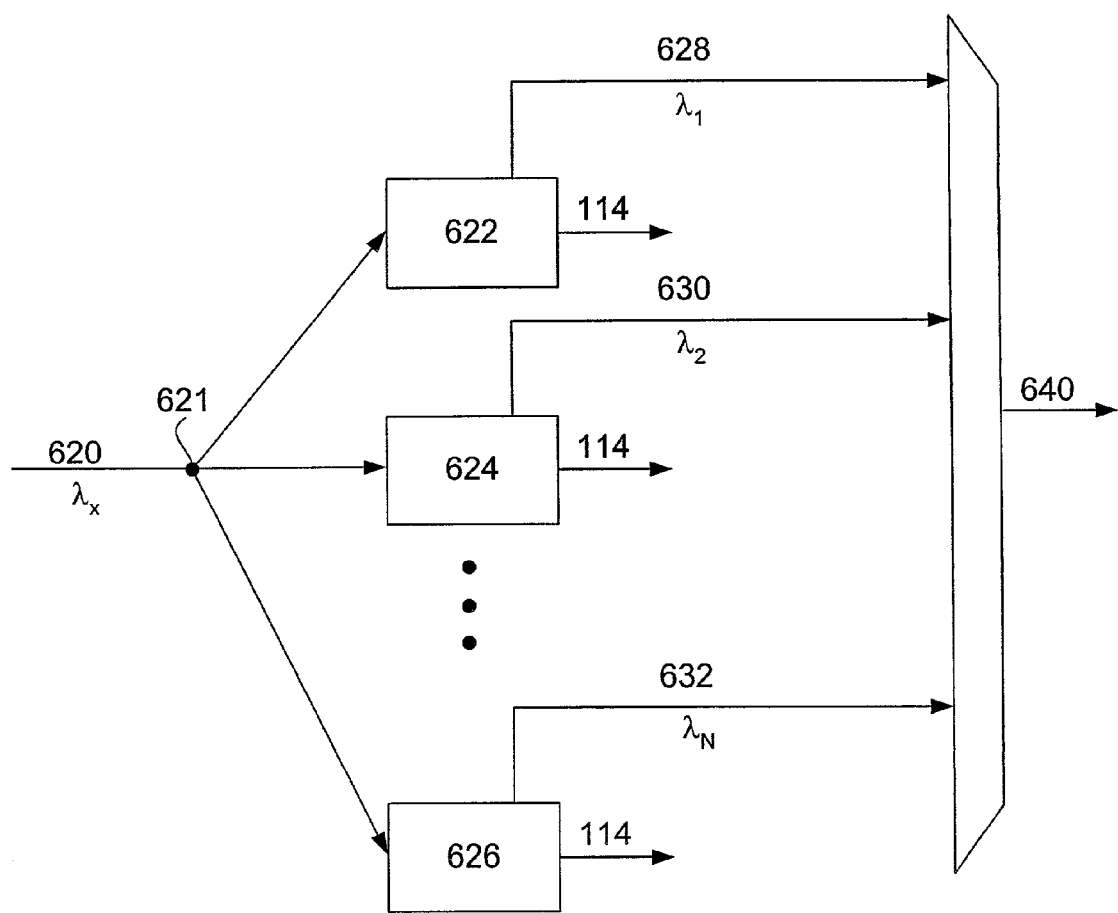
FIG. 8 is a block diagram of yet another embodiment of fixed wavelength conversion using a VLSOA.

FIG. 8 is a block diagram of yet another embodiment of a wavelength converter. The embodiment shown in FIG. 8 allows a choice of many different wavelengths to carry the signal. The embodiment in FIG. 8 includes N different VLSOA's 622–626, each configured to act as an inverter. The input signal 620 can be converted to any wavelength $\lambda_1$–$\lambda_N$, as determined by the N different VLSOA's. The input signal is sent to a selected one of the N different VLSOA's by using a selector 621. In various embodiments, the selector 621 is a mirror, such as a MEMS (micro electrical-mechanical system) mirror, a signal divider, or another component capable of selectively directing the input signal 620 to the desired VLSOA.

In one embodiment, each of the VLSOA's has different physical characteristics, so each of the VLSOA's outputs a different wavelength. The wavelength of each VLSOA is determined by the optical path length of the laser cavity, which in turn is determined by the distance between the mirrors and the refractive index of the laser cavity. Each of the VLSOA's used is chosen to have a different optical path length of the laser cavity in order to provide a different output wavelength.

If the input signal 620 is sent to the first VLSOA 622, the laser output of the first VLSOA 622 carries the output signal 628 on a first wavelength $\lambda_1$. As previously discussed, the output signal 628 is inverted relative to the input signal. The first wavelength $\lambda_1$ is determined by the characteristics of the first VLSOA 622. Similarly, if the input signal is sent to the second VLSOA 624, the laser output of the second VLSOA 624 carries the output signal 630 on a second wavelength $\lambda_2$. The second wavelength $\lambda_2$ is determined by the characteristics of the second VLSOA 624. If the input signal is sent to the Nth VLSOA 626, the laser output of the Nth VLSOA 626 carries the output signal 632 on an Nth wavelength $\lambda_N$. The Nth wavelength $\lambda_N$ is determined by the characteristics of the Nth VLSOA 626. The final output 640 of the system then is the inverted signal at the wavelength determined by which VLSOA converts the wavelength of the signal.

The embodiment shown in FIG. 8 allows the choice of many different wavelengths to carry the signal. Since each VLSOA has a different output wavelength, choosing a VLSOA to send the signal to also chooses the new wavelength of the signal. Thus, having multiple different VLSOA's allows many different final wavelengths.

Alternatively, the embodiment of FIG. 8 can be modified so that the output is not inverted. The two-VLSOA wavelength converter shown in FIG. 7 can be used in place of the single VLSOA wavelength converter of FIG. 8. The single VLSOA wavelength converters 622, 624, and 626 can each be replaced by a double VLSOA wavelength converter shown in FIG. 7. Alternatively, a first VLSOA may be placed prior to the selector. In such an embodiment, the input signal enters the input of the first VLSOA, and the output of the first VLSOA, which is the inverted input signal, goes to the selector 621. Then, the signal from the first VLSOA is sent to a selected one of the N different VLSOAs 622–626. In such embodiments, the final output 640 of the system has been re-inverted to return to its original input form.

Rather than a fixed wavelength converter, it is sometimes advantageous to use a tunable wavelength converter. In the embodiment shown in FIG. 8, each VLSOA 622, 624, and 626 has an output of a different wavelength. Occasionally, VLSOAs fail and must be replaced. If replacement VLSOAs are all fixed wavelength converters, a replacement VLSOA must be kept available for every different wavelength. This can result in a large inventory of replacement VLSOAs or significant redundancy built into the system. Keeping such a large inventory of unused VLSOAs is expensive. A VLSOA with a tunable output wavelength advantageously reduces the requirement of a large inventory of replacement VLSOAs.

Figure 9:
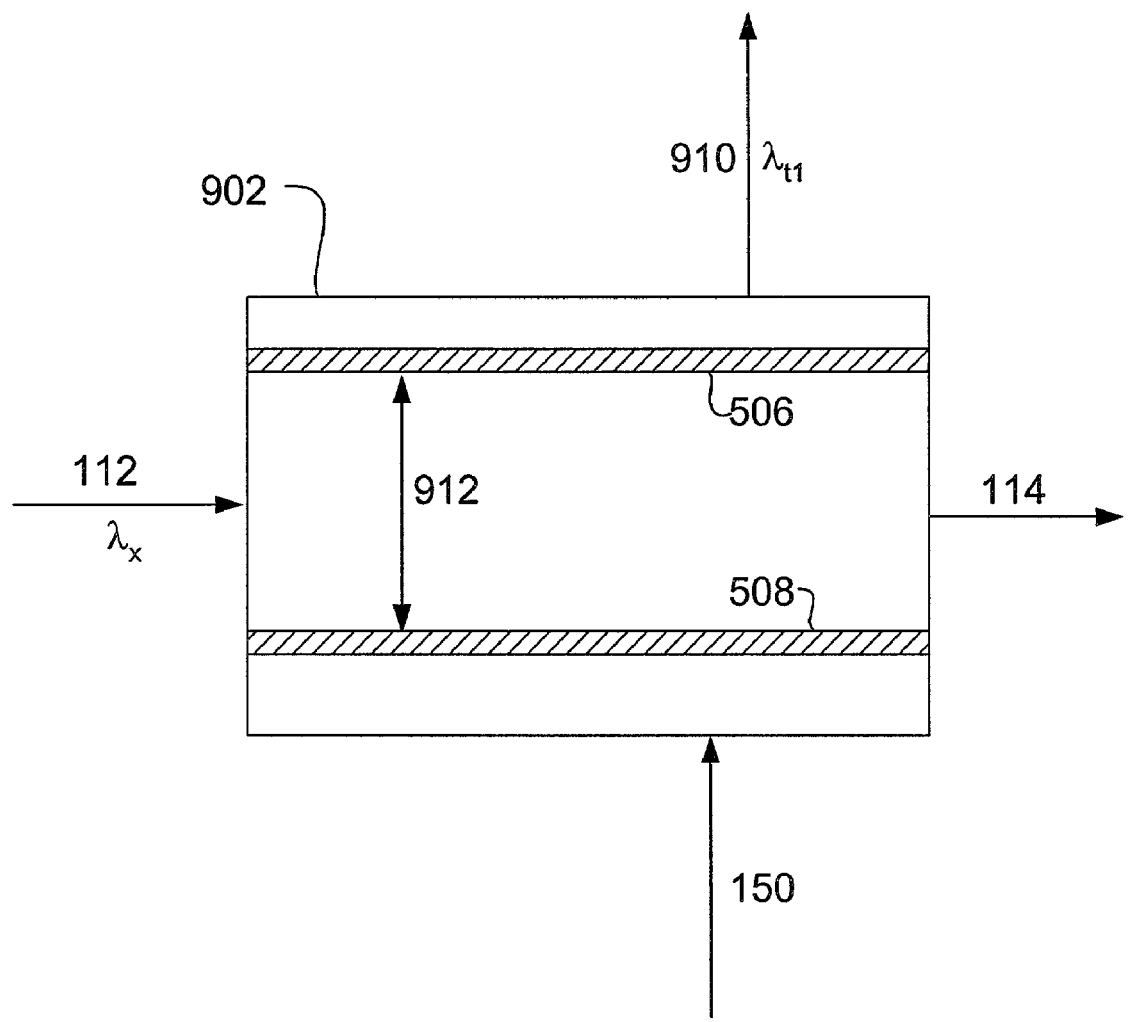
FIG. 9 is a diagram of a VLSOA 902 configured as a tunable wavelength converter.

FIG. 9 is a diagram of a VLSOA 902 configured as a tunable wavelength converter. The VLSOA 902 has an input 112 to the amplifying path, an output of the amplifying path, a pump input 150 for pumping the active region, and a laser output 910 for the laser mode of the laser cavity. The optical path length of the VLSOA 902 is tunable. Thus, because the optical path length of the laser cavity determines the wavelength $\lambda_{r1}$ of the laser output 910, the laser output 910 of the VLSOA 902 has a tunable wavelength $\lambda_{r1}$, and VLSOA 902 acts as a tunable wavelength converter.

The optical path length of the lasing cavity determines the wavelength $\lambda_{r1}$. Two aspects of the VLSOA 902 primarily determine the optical path length, and thus the wavelength $\lambda_{r1}$, of the laser output 910: the distance 912 between the mirrors 506 and 508 and the refractive index of the materials between the mirrors 506 and 508 of the VLSOA 902. In the VLSOA 902, the distance 912 between the mirrors 506 and 508, the refractive index, or both the distance 912 and the refractive index, are variable. Like the fixed wavelength converter VLSOA 602, the laser output 910 of the tunable wavelength converter VLSOA 902 is the input 112 signal inverted.

In other embodiments, other methods are used to tune the wavelength $\lambda_{r1}$ of the VLSOA 902. These methods include: (a) ring cavities where the length of the ring determines the wavelength; (b) coupled cavity resonators, where a series of Fabry-Perot cavities, or rings, or another resonant cavity collectively determine the wavelength $\lambda^{r1}$; (c) photonic band gap resonators and filters—a group of resonators and filters that are very small and filter photons much in the same way electrons in a crystal form bandgaps; (d) directional coupler filters, which allow two modes to be coupled in a wavelength dependent manner using waveguide guide modes or another type of mode; (e) grating assisted couplers, which are similar to directional coupler filters, but a grating (periodic index or gain/absorption perturbations) is used to help select the peak wavelength; (f) diffraction gratings, which cause a periodic change in index of refraction or gain/absorption across the transerse profile of the light beam such that wavelength dependent diffraction peaks ($1^{st}$ order, $2^{nd}$ order, etc.) result; (g) Echelle gratings, or one of many other types of gratings; (h) arrayed waveguide gratings, which are a series of waveguides that are phased to give wavelength dependent transmission, such as a phased array radar antenna system; (i) multi-mode interferometer filters, which utilize higher order transverse modes and their coupling between each other to achieve filter and splitter effects; (j) an asymmetric Mach-Zhender filter, which is a type of filter that utilizes a splitter, two unequal optical path lengths, and a combiner to achieve a filtered response (this can also be done using two polarizations); (k) Sagnac interferometer filter, which is similar to the Mach-Zhender but in a ring type configuration.

As with the fixed wavelength converter, the tunable wavelength converter does not require a pre-amplifier. The VLSOA is capable of amplifying the signal sufficiently so that such a pre-amplifier is unnecessary.

Figure 10A:
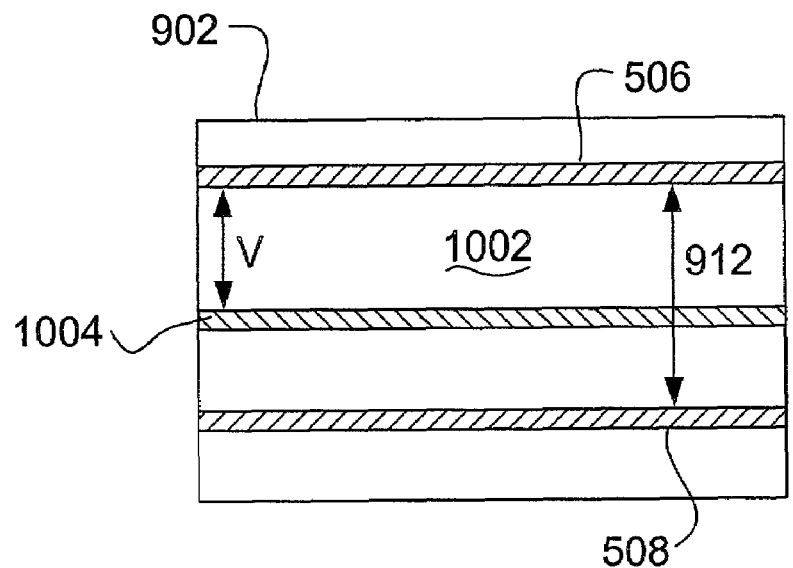
FIG. 10a is a diagram of a VLSOA with a variable distance between the mirrors.

FIG. 10a is a diagram of a VLSOA 902 with a variable distance 912 between mirrors 506 and 508. Changing the distance 912 between the mirrors 506 and 508 changes the optical path length, and thus the wavelength of the laser output. There are several ways to change the distance 912 between the mirrors 506 and 508.

A first embodiment with a variable distance 912 between the mirrors 506 and 508 uses a micro electromechanical system (MEMS) to adjust the distance 912. The VLSOA 902 includes an air gap 1002 between the top mirror 506 and the bottom mirror 508. The top mirror 506 is capable of moving closer or further from the bottom mirror 508. Preferably, the range of motion of the top mirror 506 is approximately 30 nm. A voltage V is applied between the top mirror 506 and a conducting layer 1004 to move the top mirror 506. As the voltage V is changed, the top mirror 506 moves and the distance between the mirrors 506 and 508 changes. In this embodiment, the top mirror 506 is an electrostatic deformable membrane. Preferably, as the top mirror 506 moves, it remains parallel to the active region of the VLSOA 902.

Figure 10B:
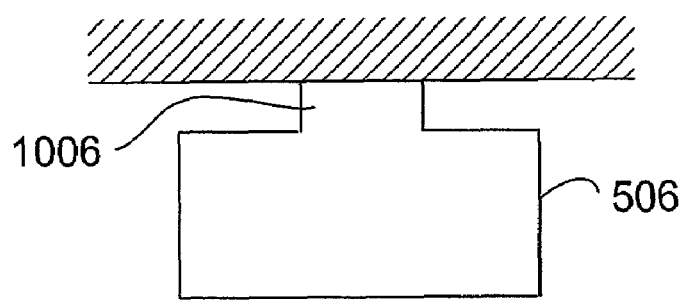
FIG. 10b is a diagram of a VLSOA with a variable distance between the mirrors, the top mirror being suspended in the air gap by a cantilever section.
Figure 10C:
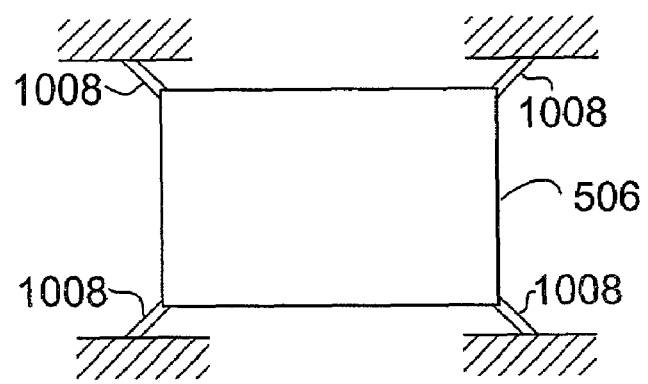
FIG. 10c is a diagram of a VLSOA with a variable distance between the mirrors, the top mirror being suspended in the air gap by flexible tethers.

There are many arrangements of the top mirror 506 that allows the top mirror 506 to move. In one embodiment, shown in FIG. 10b, the top mirror 506 is suspended in the air gap 1002 by a cantilever section 1006. In another embodiment, shown in FIG. 10c, the top mirror 506 is suspended by four flexible tethers 1008. Alternatively, a different number of tethers 1008 could be used.

Figure 11:
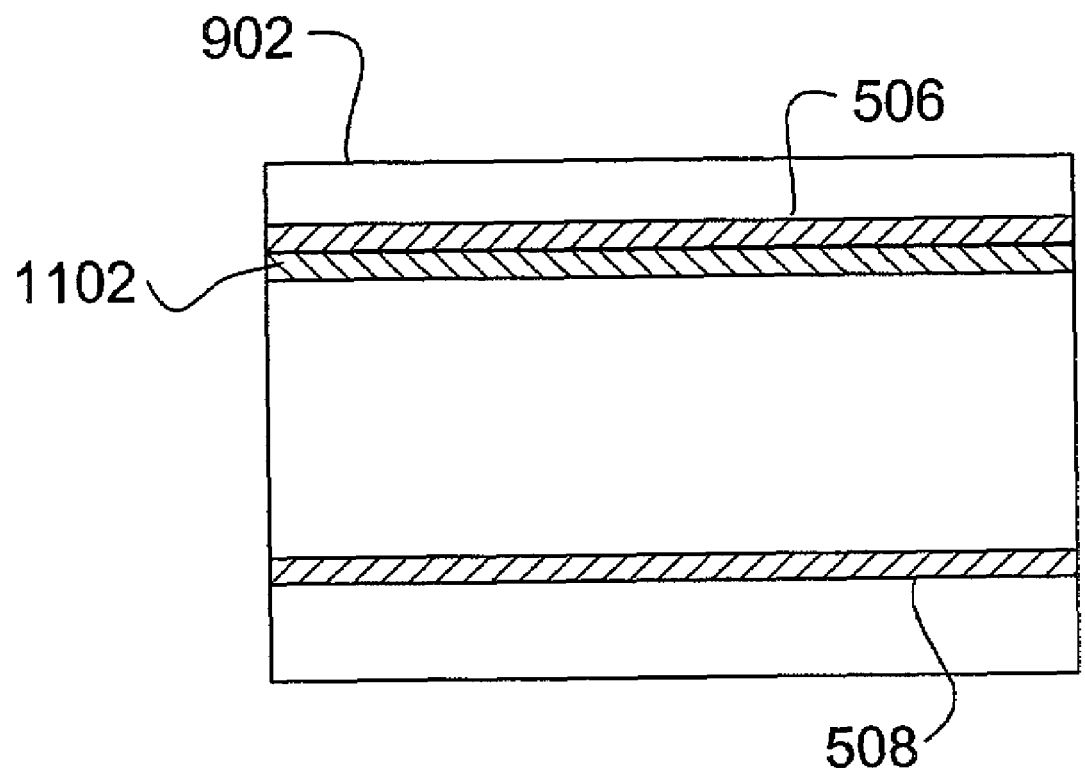
FIG. 11 is a diagram of an embodiment of a VLSOA with a tunable output wavelength.

The refractive index can also be changed to change the optical path length. There are several ways to change the refractive index. FIG. 11 is a diagram of an embodiment of a VLSOA 902 with a tunable output wavelength. The embodiment of the tunable VLSOA 902 shown in FIG. 11 includes a tunable region 1102 between the active region and the top mirror 506. The tunable region 1102 could also be placed between the active region and the bottom mirror 508. The output wavelength is tuned by changing the refractive index of the tunable region 1102.

In a first embodiment, the tunable region 1102 is a liquid crystal layer. Applying a voltage across the liquid crystal layer controllably changes the refractive index. In another embodiment, layers of temperature sensitive materials are used to make up the tunable region 1102. Changing the temperature changes the refractive index of the layers of temperature sensitive materials.

Additionally, the index of refraction of the tunable region 1102 may be adjusted using physical mechanisms which occur within semiconductor material such as, for example, the thermo-optic effect, the Stark effect, the quantum-confined Stark effect, the Franz-Keldysh effect, the Burstein-Moss effect (band filling), the electro-optic effect, the acousto-optic effect, or other techniques. These effects by themselves are described in various publicly available literature. Further, electrons and/or holes can be injected into the tunable region to cause a change in the refractive index.

Aside from having a tunable output wavelength of the laser output 910, the tunable wavelength converter VLSOA 902 is similar to the fixed wavelength converter VLSOA 602. The tunable wavelength converter VLSOA 902 is generally capable of replacing the fixed wavelength converter VLSOA 602 in applications.

Figure 12:
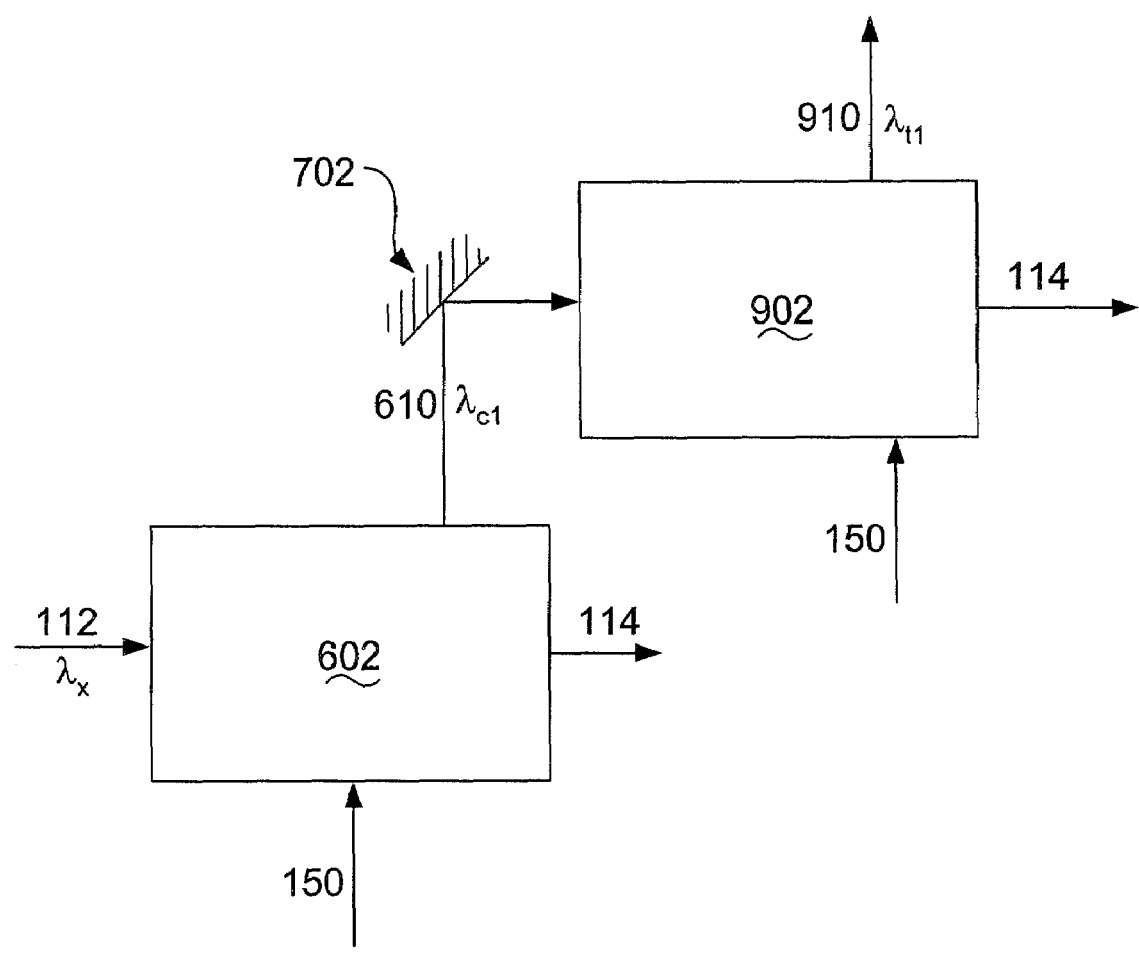
FIG. 12 is a block diagram of a tunable wavelength converter where the final, converted output is not inverted.

FIG. 12 is a block diagram of a tunable wavelength converter where the final, converted output is not inverted. The embodiment of FIG. 12 includes the VLSOA 602 of FIG. 6 as a first VLSOA. The input signal 112 of any wavelength $\lambda_x$ enters the first VLSOA 602. The laser output 610 of the first VLSOA 602 has the input signal carried by a fixed wavelength $\lambda_{c1}$. The wavelength $\lambda_{c1}$ is determined by the physical properties of the VLSOA 602, including the index of refraction and the distance between the mirrors 612, as discussed above. As discussed above, in the laser output 610 the input signal has been inverted.

This inverted signal 610 is provided as input to a second VLSOA 902. The second VLSOA 902 is the tunable VLSOA 902 of FIG. 9. As with the embodiment of FIG. 7, the inverted signal 610 can be provided as input to the second VLSOA 902 by using a mirror 702 or by positioning the VLSOAs 602, 902 with orthogonal orientations. The laser output 910 of the second VLSOA 902 acts as the final output of the wavelength converter. Since the second VLSOA 902 also acts as an inverter, the signal is re-inverted so that the signal is returned to its original form.

The optical path length of the laser cavity determines the wavelength $\lambda_{t1}$ of laser output 910. This optical path length is tunable, and is determined by the distance between the mirrors and the index of refraction of the second VLSOA 902. As discussed above, an input of any wavelength will result in the same tuned wavelength output. Thus, in the embodiment of FIG. 12, the wavelength $\lambda_{c1}$ of the output 610 of the first VLSOA 602 has no bearing on the wavelength $\lambda_{t1}$ that carries the signal. The final, converted, wavelength is determined by the characteristics of the second VLSOA 902. Thus, the embodiment shown in FIG. 12 has an input of a signal on any first wavelength $\lambda_x$ and an output of the same, non-inverted, signal on a second wavelength $\lambda_{t1}$. The second VLSOA 902 is tuned to determine the second wavelength $\lambda_{t1}$.

The tunable wavelength converter can similarly be substituted for the fixed wavelength converter in other applications.

Similar to the fixed wavelength converter, the tunable wavelength converter does not require a pre-amplifier. The VLSOA is capable of generating a high power laser output 910 so that such a pre-amplifier is unnecessary.

Figure 13:
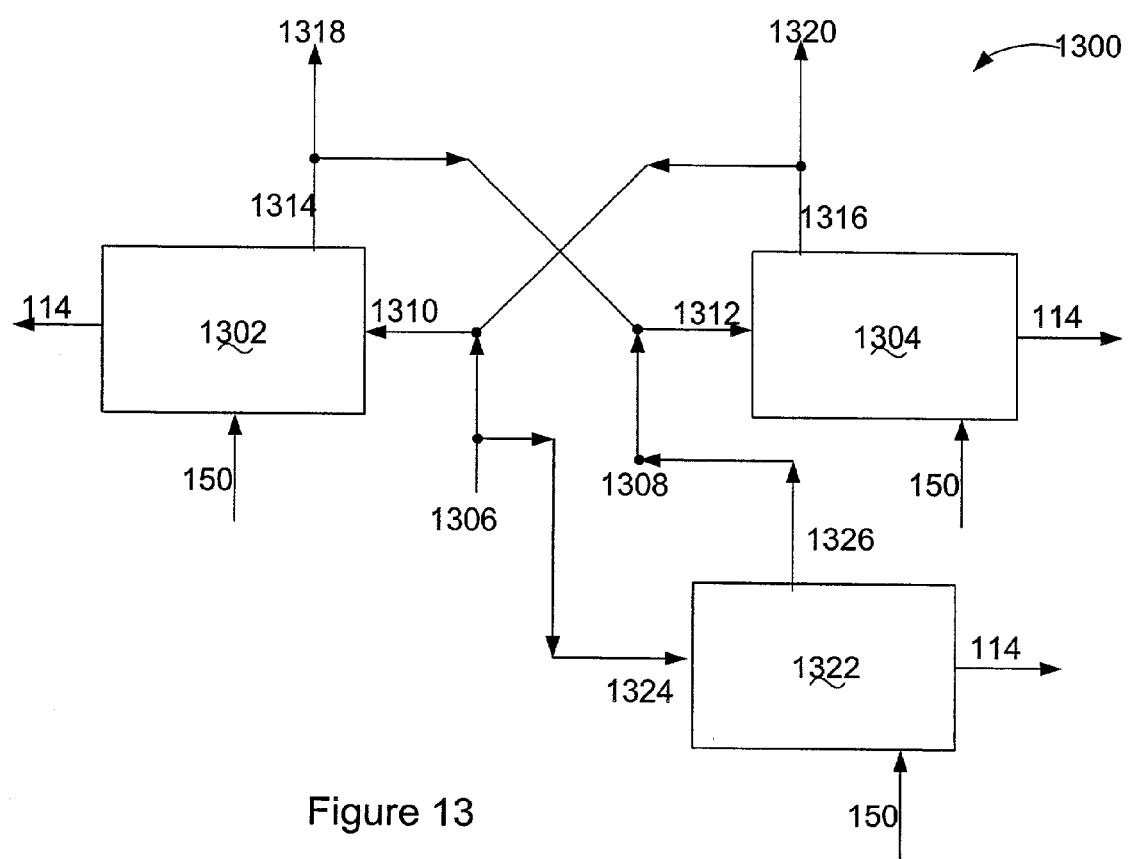
FIG. 13 is a block diagram of an optical flip-flop wavelength converter.

FIG. 13 is a block diagram of an optical flip-flop wavelength converter 1300. The flip-flop wavelength converter 1300 comprises three VLSOAs: a first VLSOA 1302, a second VLSOA 1304, and a third VLSOA 1322. The first and second VLSOAs 1302 and 1304 function as an optical flip-flop.

The two VLSOAs 1302 and 1304 in the optical flip-flop both function as inverters. The optical flip-flop has a set input 1306 and a reset input 1308. The optical flip-flop also has two outputs, a first output 1318 and a second output 1320. The set input 1306 is combined with the laser output 1316 of the second VLSOA 1304 and input 1310 to the first VLSOA 1302. The laser output 1314 of the first VLSOA 1302 is the first output 1318 of the optical flip-flop. The laser output 1314 of the first VLSOA 1302 is also combined with the reset input 1308 and input 1312 to the second VLSOA 1304. The laser output 1316 of the second VLSOA 1304 is the second output 1320 of the optical flip-flop in addition to being combined with the set input 1306 and input 1310 to the first VLSOA 1302, as previously mentioned. The output 114 of the first and second VLSOAs 1302 and 1304 is generally discarded for wavelength conversion purposes. In some embodiments, to aid in avoiding destructive interference between combined signals, the wavelengths or polarizations or both of the signals combined by combiners are selected to be different. This is done in some embodiments by using VLSOAs having laser outputs with different wavelengths.

In operation, the optical flip-flop has two stable states. The first occurs when a high signal is applied at the set input 1306. When a high signal is applied at the set input 1306, the laser output 1314 of the first VLSOA 1302 is low, since the first VLSOA 1302 acts as an inverter. Therefore, the first output 1318 of the optical flip-flop is low, and the low signal is sent to the input 1312 of the second VLSOA 1304. As the second VLSOA 1304 also acts as an inverter, the laser output 1316 of the second VLSOA 1304 is high. Thus, the second output 1320 of the optical flip-flop is high, and the high signal is sent to the input 1310 of the first VLSOA 1302. Hence, after a high signal is applied at the set input 1306, the signal can be removed. The high signal from the laser output 1316 of the second VLSOA 1304 causes the optical flip-flop to remain in the first stable state, with the first output 1318 low and the second output 1320 high.

The second stable state occurs when a high signal is applied at the reset input 1308. When a high signal is applied at the reset input 1308, the laser output 1316 of the second VLSOA 1304 is low, since the second VLSOA 1304 acts as inverter. Therefore, the second output 1320 of the optical flip-flop is low, and the low signal is sent to the input 1310 of the first VLSOA 1302. As the first VLSOA 1302 also acts as an inverter, the laser output 1314 of the first VLSOA 1302 is high. Thus, the first output 1318 of the optical flip-flop is high, and the high signal is sent to the input 1312 of the second VLSOA 1304. Hence, after a high signal is applied at the reset input 1308, the signal can be removed. The high signal from the laser output 1314 of the first VLSOA 1302 causes the optical flip-flop to remain in the second stable state, with the first output 1318 high and the second output 1320 low.

In summary, a high signal input to the set input 1306 results in a stable state of a low first output 1318 and a high second output 1320. A high signal input to the reset input 1308 results in a stable state of a high first output 1318 and a low second output 1320.

In the flip-flop wavelength converter 1300, the set input receives the input data, and the third VLSOA 1322 is connected to the optical flip-flop. The third VLSOA 1322 also functions as an inverter. A portion of the set input 1306 is input 1324 to the third VLSOA 1322. The laser output 1326 of the third VLSOA 1322 is received by the second VLSOA 1304 as the reset input 1308. This allows the optical flip-flop to be set and reset according to the set input 1306 data level. When a high signal is applied to the set input 1306, the optical flip-flop is set in a first stable state. In this first stable state, the first output 1318 is low and the second output 1320 is high. When the signal applied to the set input 1306 goes low, the third VLSOA 1322 acts to invert that signal so that a high signal is applied to the reset input 1308. This causes the optical flip-flop to be set in a second stable state. In this second stable state, the first output 1318 is high and the second output 1320 is low.

Since the set input 1306 is inverted and applied to the reset input 1308 by the third VLSOA 1322, the optical flip-flop is in either the first or second stable states, depending on the input data level. When the data signal is high enough, the outputs are in one stable state, and when the data signal drops below a threshold, the outputs are reset to the other stable state.

Either the first or second output 1318 or 1320 may be taken as the wavelength converted output. The wavelength of the first output 1318 is determined by the optical path length of the first VLSOA 1302. The wavelength of the second output 1320 is determined by the optical path length of the second VLSOA 1304. Since the data signal is applied to the set input 1306 and the first and second VLSOAs 1302 and 1304 function as inverters, the first output 1318 is the input inverted, and the second output 1320 is the original data signal, not inverted. Thus, the first output 1318 is the data signal that has been inverted and converted to a wavelength determined by the first VLSOA 1302, and the second output 1320 is the data signal non-inverted and converted to a wavelength determined by the second VLSOA 1304.

The first and second VLSOAs 1302 and 1304 each may have laser outputs with fixed wavelengths, such as VLSOA 602, with tunable wavelengths, such as VLSOA 902. Thus, the flip-flop wavelength converter 1300 can be either a fixed wavelength converter or a tunable wavelength converter.

In some embodiments, a second input is combined with the data input and applied to the set input 1306. This second input can be chosen to determine the flipping threshold of the data input. In yet another embodiment, this second input is a clock input, and the flipping threshold is chosen so that both the clock signal and the data input must be high to activate the first stable state. This provides a clocked flip-flop wavelength converter.

Figure 14:
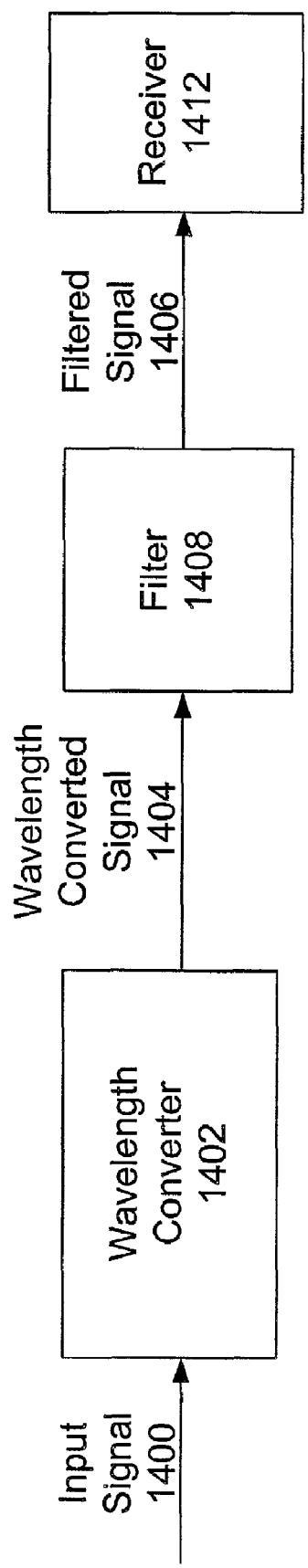
FIG. 14 is a block diagram illustrating one application for a wavelength converter.

FIG. 14 is a block diagram illustrating one application for a wavelength converter. The application shown in FIG. 14 is a wavelength converter that allows the use of a pre-amplified PIN receiver in an optical system. One such optical system in which such a receiver would be advantageous is a dense wavelength division multiplexer (DWDM). In such systems, there are three levels of receivers, with the first level being the worst and the third level being the best. The first level is a PIN photodiode receiver. The second level is an avalanche photodiode (APD) receiver. The third and best level is a pre-amplified receiver, such as a pre-amplified PIN photodiode receiver.

While the best receiver is the pre-amplified PIN receiver, these receivers have not been used in the past. This is because optical amplifiers, necessary to supply the pre-amplification, have been too expensive. Further, the prior optical amplifiers, such as erbium-doped fiber amplifiers (EDFAs) are large, and cannot be fabricated as an integrated unit with the receiver. Finally, pre-amplified PIN receivers require a filter between the amplifier and the receiver to eliminate out-of-band light. Typical receiver bandwidth is about 2 nm, while the optical amplifier outputs an ASE (amplified spontaneous emission) having a band width of more than 60 nm.

The first two problems are solved by using an LSOA as an optical amplifier, as discussed above. The LSOA is far less expensive than previous optical amplifiers. The LSOA also may be integrated with the receiver. However, the third problem is not solved. The receiver used is chosen based on the wavelength that the receiver is to detect. Different receivers detect different wavelengths. Thus, in DWDM applications, where there are many different wavelengths, this creates a "sparing" problem. A "sparing" problem is a problem where many spare components as backups. For example, in a DWDM system with 100 different channels on 100 different wavelengths, 100 different spare receivers must be kept on hand to provide backup. Each spare receiver has a filter for the particular wavelength it will receive. Alternatively, the receiver could have a tunable filter, although this also increases size and cost.

The system illustrated in FIG. 14 solves this problem. In FIG. 14, the input signal 1400 has an unknown wavelength. The input signal 1400 has been pre-amplified, in some embodiments by an LSOA, and is received by a wavelength converter 1402. The wavelength converter 1402 may be one of the wavelength converters described above. No matter what wavelength the input signal 1400 has, the wavelength converter 1402 outputs the signal on a wavelength that is known and determined by the wavelength converter 1402. Thus, the wavelength converter 1402 outputs a wavelength converted signal 1404. This wavelength converted signal 1404 is received by the filter 1408. Since the wavelength converted signal 1404 has a wavelength determined by the wavelength converter 1402, only one filter is needed in the system. The filter 1408 filters the wavelength converted signal 1404 and sends the filtered signal 1406 to the receiver 1412, where it is detected.

Thus, since the wavelength converter 1402 outputs a signal on a known wavelength regardless of the input wavelength, multiple different filters are not necessary. The wavelength converter 1402 will output the same wavelength to the filter 1408 for different input signal 1400 wavelengths. In addition, the wavelength converter 1402 based on LSOAs may be integrated with the filter 1408 and receiver 1412, further reducing cost and size. By using such a wavelength converter 1402, the system in FIG. 14 acts as a broadband receiver such as a PIN photodiode or APD, but with improved sensitivity.

The invention has been particularly shown and described with reference to a preferred embodiment and several alternate embodiments, it will be understood by persons skilled in the relevant art that various changes in form and details can be made therein without departing from the spirit and scope of the invention. For example, instead of a VLSOA, a transverse lasing semiconductor optical amplifier (TLSOA) or longitudinal lasing semiconductor optical amplifier (LLSOA) may be used.

We claim:

1. A method for converting an input optical signal from a first wavelength to a second wavelength using a lasing semiconductor optical amplifier (LSOA) comprising an input, a laser cavity with an optical path, an amplifying path connected to the input and passing through the laser cavity, and a laser output, comprising the steps of:
    inputting the input optical signal on the first wavelength to the input of the LSOA;
    pumping the laser cavity of the LSOA to exceed a lasing threshold for the laser cavity;
    propagating the input optical signal along the amplifying path of the LSOA; and
    in response to the input optical signal propagating along the amplifying path, outputting from the laser output of the LSOA an output optical signal based on the input signal and having the second wavelength.

2. The method of claim 1, wherein the output optical signal is the input optical signal inverted.

3. The method of claim 1, wherein the second wavelength is determined by an optical path length of the optical path of the laser cavity of the LSOA.

4. The method of claim 3, wherein the optical path length and the second wavelength are fixed.

5. The method of claim 3, wherein the optical path length and the second wavelength are variable.

6. The method of claim 5, further comprising selecting the optical path length.

7. The method of claim 6, wherein the laser cavity of the LSOA further comprises a first mirror and a second mirror, and selecting the optical path length comprising selecting a distance between the fist and second mirrors.

8. The method of claim 7, wherein the first mirror is a micro elect-mechanical system (MEMS) mirror with a variable position and selecting the distance between the first and second mirrors comprises selecting the position of the first mirror.

9. The method of claim 8, wherein the laser cavity of the LSOA further comprises a conducting layer and selecting the position of the first mirror comprises applying a selected voltage between the first mirror and the conducting layer.

10. The method of claim 6, wherein the laser cavity of the LSOA further comprises a tunable region with a selectable refractive index, and selecting the optical path length comprises selecting the refractive index of the tunable region.

11. The method of claim 1, wherein the LSOA Is a vertical lasing semiconductor optical amplifier (VLSOA).

12. The method of claim 1, wherein the LSOA is a transverse lasing semiconductor optical amplifier (TLSOA).

13. The method of claim 1, wherein the LSOA is a longitudinal lasing semiconductor optical amplifier (LLSOA).

14. An apparatus for converting an input optical signal from a first wavelength to a second wavelength, comprising:
    a first lasing semiconductor optical amplifier (LSOA), comprising:
        an input for receiving the optical signal on the first wavelength;
        a laser cavity with an optical path;
        an amplifying path connected to the input and passing through the laser cavity for propagating the input optical signal;
        a pump input connected to the laser cavity for receiving a pump for exceeding a lasing threshold for the laser cavity, and
        a laser output for outputting an intermediate optical signal in response to the input optical signal propagating through the amplifying path; and
        a laser output for outputting an intermediate optical signal in response to the input optical signal propagating through the amplifying path; and
    a second LSOA, comprising:
        an input coupled to the laser output of the first LSOA for receiving the intermediate optical signal from the laser output of the first LSOA;
        a laser cavity with an optical path having an optical path length;
        an amplifying path connected to the input and passing through the laser cavity for propagating the intermediate optical signal;
        a pump input connected to the laser cavity for receiving a pump for exceeding a lasing threshold for the laser cavity; and
        a laser output for outputting an output optical signal in response to the intermediate optical signal propagating through the amplifying path, the output optical signal based on the input optical signal and having the second wavelength.

15. The apparatus of claim 14, wherein the second wavelength is determined by the optical path length of the laser cavity of the second LSOA.

16. The apparatus of claim 15, wherein the optical path length of the laser cavity of the second LSOA and the second wavelength are fixed.

17. The apparatus of claim 15, wherein the optical path length of the laser cavity of the Second LSOA and the second wavelength are variable.

18. The apparatus of claim 17, wherein the laser cavity of the second LSOA further comprises:
   a first mirror, and
   a second mirror separated from the first mirror by the distance, the distance being variable.

19. The apparatus of claim 18, wherein the first mirror is a micro electro-mechanical System (MEMS) mirror with a variable position.

20. The apparatus of claim 19, wherein the laser cavity of the second LSOA further comprises a conducting layer for varying the position of the first mirror by applying a selected Voltage between the first mirror and the conducting layer.

21. The apparatus of claim 17, wherein the laser cavity of the second LSOA further comprises a tunable region with a selectable refractive index.

22. The apparatus of claim 14, wherein the first LSOA is a vertical lasing semiconductor Optical amplifier (VLSOA).

23. The apparatus of claim 14, wherein the first LSOA is a transverse lasing semiconductor optical amplifier (TLSOA).

24. The apparatus of claim 14, wherein the first LSOA is a longitudinal lasing semiconductor optical amplifier (LLSOA).

25. A method for converting an input optical signal from a first wavelength to a second wavelength using a first lasing semiconductor optical amplifier (LSOA) and a second LSOA, each of the first and second LSOAs comprising an input, a laser cavity with an optical path having an optical path length, an amplifying path connected to the input and passing through the laser cavity, and a laser output, comprising the steps of:
   receiving the input optical signal on the first wavelength at the input of the first LSOA;
   pumping the laser cavity of the first LSOA to exceed a lasing threshold for the laser cavity of the first LSOA;
   propagating the input optical signal along the amplifying path of the first LSOA;
   in response to the input optical signal propagating along the amplifying path, outputting from the laser output of the first LSOA an intermediate optical signal;
   receiving the intermediate optical signal at the input of the second LSOA;
   pumping the laser cavity of the second LSOA to exceed a lasing threshold for the laser cavity of the second LSOA;
   propagating the intermediate optical signal propagating along the amplifying path, outputting from the laser output of the second LSOA an output optical signal, the output signal based on the input optical signal and having the second wavelength.

26. The method of claim 25, wherein the second wavelength is determined by the optical path length of the laser cavity of the second LSOA.

27. The method of claim 26, wherein the optical path length of the laser cavity of the second LSOA and the second wavelength are fixed.

28. The method of claim 26, wherein the optical path length of the laser cavity of the second LSOA and the second wavelength are variable.

29. The method of claim 28, further comprising selecting the optical path length of the laser cavity of the second LSOA.

30. The method of claim 29, wherein the laser cavity of the second LSOA further comprises a first mirror and a second mirror, and selecting the optical path length of the laser cavity of the second LSOA comprises selecting a distance between the first and second mirrors.

31. The method of claim 30, wherein the first mirror is a micro electro mechanical system (MEMS) mirror with a variable position and selecting the distance between the first and second mirrors comprises selecting the position of the first mirror.

32. The method of claim 31, wherein the laser cavity of the second LSOA further comprises a conducting layer and selecting the position of the first mirror comprises applying a selected voltage between the first mirror and the conducting layer.

33. The method of claim 29, wherein the laser cavity of the second LSOA further comprises a tunable region with a selectable refractive index, and selecting the optical path length of the laser cavity comprises selecting the refractive index of the tunable region.

34. The method of claim 25, wherein the first LSOA is a vertical lasing semiconductor optical amplifier (VLSOA).

35. The method of claim 25, wherein the first LSOA is a transverse lasing semiconductor optical amplifier (TLSOA).

36. The method of claim 25, wherein the first LSOA is a longitudinal lasing semiconductor optical amplifier (LLSOA).

37. An apparatus for converting an input optical signal from a first wavelength to a selected second wavelength, comprising:
   an input for receiving the input optical signal;
   a selector for directing the input optical signal to a selected one of a plurality of lasing semiconductor optical amplifiers (LSOA), each LSOA comprising:
     an input for receiving the input optical signal on the first wavelength;
     a laser cavity with an optical path having an optical path length;
     an amplifying path connected to the input and passing through the laser cavity for propagating the input optical signal;
     a pump input connected to the laser cavity for receiving a pump for exceeding a lasing threshold for the laser cavity; and
     a laser output for outputting an output optical signal in response to the input optical signal propagating through the amplifying path, the output optical signal based on the input optical signal and having the second wavelength, the second wavelength being determined by the optical path length of the selected LSOA.

38. An apparatus for converting an input optical signal from a first wavelength to a second wavelength, comprising:
   an input for receiving the input optical signal on the first wavelength;
   a laser cavity with a selectively variable optical path length;
   an amplifying path connected to the input and passing through the laser cavity for propagating the input optical signal;
   a pump input connected to the laser cavity for receiving a pump that exceeds a lasing threshold for the laser cavity; and
   a laser output for outputting an output optical signal in response to the input optical signal propagating through the amplifying path, the output optical signal based on the input optical signal and having the second wavelength, the second wavelength being determined by the optical path length of the laser cavity.

39. The apparatus of claim 38, wherein the output optical signal is the input optical signal inverted.

40. The apparatus of claim 38, wherein the laser cavity further comprises:
a first mirror; and
a second mirror separated from the first mirror by a distance, the distance being variable.

41. The apparatus of claim 40, wherein the first mirror is a micro electro-mechanical system (MEMS) mirror with a variable position.

42. The apparatus of claim 41, wherein the laser cavity further comprises a conducting layer for varying the position of the first mirror by applying a selected voltage between the first mirror and the conducting layer.

43. The apparatus of claim 38, wherein the laser cavity further comprises a tunable region with a selectable refractive index.

44. An apparatus for converting an input optical signal from an original wavelength to a converted wavelength, comprising:
a first output;
a second output;
a set input for receiving the input optical signal;
a reset input
a first lasing semiconductor optical amplifier (LSOA), comprising:
  an input for receiving optical signals and connected to the set input;
  a laser cavity with an optical path having an optical path length;
  an amplifying path connected to the input and passing through the laser cavity for propagating the optical signals received at the input;
  a pump input connected to the laser cavity for receiving a pump for exceeding a lasing threshold for the laser cavity; and
  a laser output connected to the first output for outputting a first output optical signal on a first converted wavelength in response to the optical signals propagating through the amplifying path;
a second LSOA, comprising:
  an input or receiving optical signals and coupled to the reset input and to the laser output of the first LSOA;
  a laser cavity with an optical path having an optical path length;
  an amplifying path connected to the input and passing through the laser cavity for propagating the optical signals received at the input;
  a pump input connected to the laser cavity for receiving a pump for exceeding a lasing threshold for the laser cavity; and
  a laser output connected to the second output and to the input of the first LSOA for outputting a second output optical signal on a second converted wavelength in response to the optical signals propagating through the amplifying path; and a third LSOA, comprising:
  an input for receiving optical signals and coupled to the set input;
  a laser cavity with an optical path having an optical path length;
  an amplifying path connected to the input and passing through the laser cavity for propagating the optical signals received at the input;
  a pump input connected to the laser cavity for receiving a pump for exceeding a lasing threshold for the laser cavity; and
  a laser output connected to the rest input for outputting a third output optical signal in response to the optical signals propagating through the amplifying path.

45. A method for converting an input optical signal from an original wavelength to a converted wavelength using a first lasing semiconductor optical amplifier (LSOA), a second LSOA, and a third LSOA, each of the first, second, and third LSOAs comprising an input, a laser cavity with an optical path having an optical path length, an amplifying path connected to the Input and passing through the laser cavity, and a laser output, comprising the steps of:
receiving a second output optical signal from the laser output of the second LSOA at the input of the first LSOA;
pumping the laser cavity of the first LSOA to exceed a lasing threshold for the laser cavity of the first LSOA;
pumping the laser cavity of the third LSOA to exceed a lasing threshold for the laser cavity of the third LSOA;
propagating the received optical signal along the amplifying path of the first LSOA;
propagating the received optical signal along the amplifying path of the third LSOA;
in response to the received optical propagating along the amplifying path of the first LSOA, outputting from the laser output of the first LSOA a first output optical signal on a first converted wavelength;
in response to the received optical signal propagating along the amplifying path of the third LSOA, outputting from the laser output of the third LSOA a third output optical signal;
receiving the first output optical signal and the third output optical signal at the input of the second LSOA;
pumping the laser cavity of the second LSOA to exceed a lasing threshold for the laser cavity of the second LSOA;
propagating the received optical signals along the amplifying path of the second LSOA; and
in response to the received optical signals propagating along the amplifying path of second output optical signal, the second output optical signal based on the Input optical signal and having a second converted wavelength.

46. The apparatus of claim 45, further comprising receiving a clock input signal at the input of the fist LSOA and the input of the third LSOA.

\* \* \* \* \*

UNITED STATES PATENT AND TRADEMARK OFFICE
CERTIFICATE OF CORRECTION

PATENT NO.      : 6,950,233 B1
APPLICATION NO. : 10/017200
DATED           : September 27, 2005
INVENTOR(S)     : DiJaili et al.

It is certified that error appears in the above-identified patent and that said Letters Patent is hereby corrected as shown below:

Cover Page
Item [56], References Cited, U.S. PATENT DOCUMENTS, add the following patent references:

| | | | |
|---|---|---|---|
| 3,467,906 | 9/1969 | Cornely et al. | 330/4.3 |
| 3,828,231 | 8/1974 | Yamamoto | 357/30 |
| 4,794,346 | 12/1988 | Miller | 330/4.3 |
| 5,299,054 | 3/1994 | Geiger | 359/251 |
| 5,305,412 | 4/1994 | Paoli | 385/122 |
| 5,436,759 | 7/1995 | Dijaili et al. | 359/333 |
| 5,604,628 | 2/1997 | Parker et al. | 359/344 |
| 5,754,571 | 5/1998 | Endoh et al. | 372/20 |
| 5,771,320 | 6/1998 | Stone | 385/16 |
| 5,778,132 | 7/1998 | Csipkes et al. | 385/135 |
| 5,805,322 | 9/1998 | Tomofuji | 359/177 |
| 5,999,293 | 12/1999 | Manning | 359/139 |
| 6,061,156 | 5/2000 | Takeshita et al. | 359/117 |
| 6,115,517 | 9/2000 | Shiragaki et al. | 385/24 |
| 6,128,115 | 10/2000 | Chen et al. | 385/17 |
| 6,333,799 | 12/2001 | Bala et al. | 359/128 |
| 6,335,992 | 1/2002 | Bala et al. | 385/17 |

Item [56], References Cited, FOREIGN PATENT DOCUMENTS, add the following foreign patent references:
  JP          56006492          1/1981

Item [56], References Cited, OTHER PUBLICATIONS, add the following publication references:
Walker, J.D., Patterson, F.G., Dijaili, S.P. and Deri R.J., "A Gain-Clamped, Crosstalk Free, Vertical Cavity Lasing Semiconductor Optical Amplifier for WDM Applications", Lawrence Livermore National Laboratory, Livermore, CA Alcatel, "Alcatel Optronics Introduces a Gain-Clamped Semiconductor Optical Amplifier," Press Release for Immediate Publication, OFC '98, San Jose, 1 unnumbered page, (Feb. 1998).

Signed and Sealed this

Twelfth Day of October, 2010

David J. Kappos
*Director of the United States Patent and Trademark Office*

Diez, S., Ludwig, R., and Weber, H.g., "all-Optical Switch for TDM and WDM/TDM Systems Demonstrated in a 640 Gbit/s Demultiplexing Experiment," Electronics Letters, Vol. 34, No. 8, Pgs. 803–805, April 16, 1988.

Diez, S., Ludwig, R., and Weber, H.G., Gain-Transparent SOA-Switch for High-Bitrate OTDM Add/Drop Multiplexing," IEEE Photonics Technology Letters, Vol. 11, No. 1, Pgs. 60–62, January 1999.

Diez, S., Ludwig, R., and Weber, H.G., "Gain-Transparent SOA-Switch for High Bitrate OTDM Add/Drop Multiplexing," ECOC'98, Vol. 1, Pages 461–462, September 1998.

Dorgeuille, F., Noirie, L., Faure, J-P., Ambrosy, A., Rabaron, S., Boubal, F., Schilling, M., and Artigue, C., "1.28 Tbit/s Throughput 8x8 Optical Switch Based on Arrays of Gain-Clamped Semiconductor Optical Amplifier Gates," Optical Fiber Communication Conference, Vol. 4, Pages 221–223, March 2000.

Gorgeuille, F., Lavine, B., Emery, J.y., Di Maggio, M., Le Bris, J., Chiaroni, D., Renaud, M., Baucknecht, R., Schneibel, H.P., Graf, C., and Melchior, H., "Fast Optical Amplifier Gate Array for WDM Routing and Switching Applications," OFC '98 Technical Digest, Pages 42–44, 1998.

Doussiere, P., Jourdan, A., Soulage, G., Garabédian, P., Graver, C., Fillion, T., Derouin, E., and Leclerc, D., "Clamped Gain Traveling Wave Semiconductor Optical Amplifier for Wavelength Division Multiplexing Application," IEEE, US, Vol. Conf. 14, Pages 185–186, New York, September 14, 1994.

Evankow, Jr., J.D., and Thompson, R.A., "Photonic Switching Modules Designed with Laser Diode Amplifiers," IEEE, Journal on Selected Areas in Communications, Vol. 6, No. 7, Pages 1087–1095, August 1988.

Fernier, B., Brosson, P., Bayart, D., Doussiére, P., Beaumont, R., Leblond, F., Morin, P., Da Loura, G., Jacquet, J., Derouin, E., and Garabedian, P., "Fast (300 ps) Polarization Insensitive Semiconductor Optical Amplifier Switch with Low Driving Current (70 mA)," Semiconductor Laser Conference, Conference Digest, 13th IEEE International, Pages 130–131, September 21–25, 1992.

Fouquet, J.E., Vankatesh, S., Troll, M., Chen, D., Schiaffino, S., and Barth, P.W., "Compact Scalable Fiber Optic Cross-Connect Switches," IEEE, 1999 Diest of the LEOS Summer Topical Meetings, Pages 59–60, 1999.

Ibrahim, M.M., "Photonic Switch Using Surface-Emitting Laser Diode and APD," 16th National Radio Science Conference, NRSC'99, Pages 1–8, Ain Shams University, Cairo, Egypt, February 23–25, 1999.

Jeong, G., and Goodman, J.W., "Gain Optimization in Switches Based on Semiconductor Optical Amplifiers," Journal of Lightwave Technology, Vol. 13, No. 4, Pages 598–605, April 1995.

Kitamura, S., Hatakeyama, H., and Hamamoto, K., "Spot-Size Converter Integrated Semiconductor Optical Amplifiers for Optical Gate Applications," IEEE Journal of Quantum Electronics, Vol. 35, No. 7, Pages 1067–1074, July 1999.

Leuthold, J., Besse, P.A., Eckner, J., Gamper, E., Dülk, M., and Melchior, H., "All-Optical Space Switches with Gain and Principally Ideal Extinction Ratios," IEEE Journal of Quantum Electronics, Vol. 34, No. 4. Pages 622–633, April 1998.

McAdams, L.R., Waverka, R.T., and Cloonan, J., "Linearizing High Performance Semiconductor Optical Amplifiers: Techniques and Performance," LEOS Presentation, Pages 363–364, 1996.

Mørk, J., and Mecozzi, A., "Semiconductor Devices for All-Optical Signal Processing: Just How Fast Can They Go?," IEEE Lasers and Electro-Optics Society 1999 $12^{th}$ Annual Meeting, LEOS'99, Vol. 2, Pages 900–901, November 8–11, 1999.

Mutalik, V.G., van den Hoven, G., and Tiemeijer, L., "Analog Performance of 1310nm Gain-Clamped Semiconductor Optical Amplifiers," OFC '97 Technical Digest, Pages 266–267, 1997.

Panajotov, K., Ryvkin, B., Peeters, M., Verschaffelt, G., Danckaert, J., Thienpont, H., Veretennicoff, I., "Poarisation Switching in Proton-Implanted VCSELs," 1999 Digest of the LEOS Summer Topical Meetings, Pages 55–56, July 26–30, 1999.

Qui, B.C., Ke, M.L., Kowalski, O.P., Bryce, A.C., Aitchison, J.S., Marsh, J.H., Owen, M., White, I.H., and Penty, R.V., "Monolithically Integrated Fabrication of 2x2 and 4x4 Crosspoint Switches Using Quantum Well Intermixing," 2000 International Conference on Indium Phosphide and Related Materials, Conference Proceedings, Pages 415–418, May 14–18, 2000.

Scheuer, J., Arbel, D., and Orenstein, M., "Nonlinear On-Switching of High Spatial Frequency Patterns in Ring Vertical Cavity Surface Emitting Lasers," 1999 IEEE LEOS Annual Meeting Conference Proceedings, $12^{th}$ Annual Meeting, IEEE Lasers and Electro-Optics Society 1999 Annual Meeting, Vol. 1, Pages 123–124, November 8–9, 1999.

Soto, H., Erasme, D., and Guekos, G., "All-Optical Switch Demonstration Using a Birefringence Effect in a Semiconductor Optical Amplifier," IEEE CLEO, Pacific Rim '99, Pages 888–889, 1999.

Soulage, G., Doussiére, P., Jourdan, A., and Sotom, M., "Clamped Gain Travelling Wave Semiconductor Optical Amplifiers as a Large Dynamic Range Optical Gate," Alcatel Alsthom Recherche, route de Norzay, 91460 Maroussis (France), 4 unnumbered pages, undated.

Tai, C., and Way, W.I., "Dynamic Range and Switching Speed Limitations of an N x N Optical Packet Switch Based on Low-Gain Semiconductor Optical Amplifiers," IEEE Journal of Lightwave Technology, Vol. 14, No. 4, Pages 525–533, April 4, 1996.

Tiemeijer, L.F., Walczyk, S., Verboven, A.J.M., van den Hoven, G.N., Thijs, P.J.A., van Dongen, T., Binsma, J.J.M., and Jansen, E.J., "High-Gain 1310 nm Semiconductor Optical Amplifier Modules with a Built-in Amplified Signal Monitor for Optical Gain Control," IEEE Photonics Technology Letters, Vol. 9, No. 3, Pages 309–311, March 1997.

Toptchiyski, G., Kindt, S., and Petermann, K., "Time-Domain Modeling of Semiconductor Optical Amplifiers for OTDM Applications," IEEE Journal of Lightwave Technology, Vol. 17, No. 12, Pages 2577–2583, December 1999.

Tiemijer, L.F., Thijs, P.J.A., Dongen, T.v., Binsma, J.J.M., Jansen, E.J., van Helleputte, H.R.J.R., "Reduced Intermodulation Distortion in 1300 nm GainClamped MQW Laser Amplifiers," IEEE Photonics Technology Letters, Vol. 7, No. 3, Pages 284–286, March 1995.

van Roijen, R., van der Heijden, M.M., Tiemeijer, L.F., Thijs, P.J.A., van Dogen, T., Binsma, J.J.M., and Verbeek, B.H., "Over 15 dB Gain from a Monolithically Integrated Optical Switch with an Amplifier," IEEE Photonics Technology Letters, Vol. 5, No. 5, Pages 529–531, May 1993.

Yoshimoto, N., Magari, K., Ito, T., Kawaguchi, Y., Kishi, K., Kondo, Y., Kadota, Y., Mitomi, O., Yoshikuni, Y., Hasumi, Y., Tohmori, Y., and Nakajima O., "Spot-Size Converted Polarization-Insensitive SOA Gate with a Vertical Tapered Submicrometer Stripe Structure," IEEE Photonics Technology Letters, Vol. 10, No. 4, Pages 510–512, April 4, 1998.

Column 1
Line 41, change "system" to --systems--

Column 4
Line 16, before "VLSOA" insert --a--

Column 6
Line 36, change "FIG. 5." to --FIG. 5b.--
Line 64, change "FIG. 5" to --FIG. 5b--

Column 7
Line 18, change "FIG. 5," to --FIG. 5b,--

Column 12
Line 25, after "output" insert --114--
Line 50, change "$\lambda^{t1}$" to --$\lambda_{t1}$--

Column 13
Line 34, change "allows" to --allow--

Column 16
Line 66, after "components" insert --are kept--

Column 18
Line 8, change "fist" to --first--
Line 10, change "elect-mechanical" to --electro-mechanical--

Column 19
Line 13, change "System" to --system--
Line 18, change "Voltage" to --voltage--
Line 24, change "Optical" to --optical--

Column 20
Line 10, change "electro mechanical" to --electro-mechanical--
Line 11, after "variable position" insert --,--

Column 21
Line 46, change "input or" to --input for--

Column 22
Line 12, change "rest" to --reset--
Line 22, change "Input" to --input--
Line 54, change "Input" to --input--